(12) United States Patent
Schmid et al.

(10) Patent No.: US 11,258,020 B2
(45) Date of Patent: Feb. 22, 2022

(54) CROSSLINKING P-DOPANTS FOR P-DOPING ORGANIC HOLE CONDUCTORS

(71) Applicants: OSRAM OLED GmbH, Regensburg (DE); Merck Patent GmbH, Darmstadt (DE)

(72) Inventors: Günter Schmid, Hemhofen (DE); Florian Kessler, Wachenroth (DE); Katja Stegmaier, Darmstadt (DE); Fabrice Eckes, Saint Louis (FR); Holger Heil, Frankfurt (DE); Beate Burkhart, Darmstadt (DE); Henning Seim, Darmstadt (DE)

(73) Assignees: OSRAM OLED GmbH, Regensburg (DE); MERCK Patent GmbH, Darmstadt (DE)

( * ) Notice: Subject to any disclaimer, the term of this patent is extended or adjusted under 35 U.S.C. 154(b) by 417 days.

(21) Appl. No.: 16/307,294

(22) PCT Filed: Jun. 14, 2017

(86) PCT No.: PCT/EP2017/064636
§ 371 (c)(1),
(2) Date: Dec. 5, 2018

(87) PCT Pub. No.: WO2017/216271
PCT Pub. Date: Dec. 21, 2017

(65) Prior Publication Data
US 2019/0140190 A1    May 9, 2019

(30) Foreign Application Priority Data
Jun. 16, 2016    (DE) .................... 10 2016 111 062.0

(51) Int. Cl.
*H01L 51/50* (2006.01)
*H01L 51/00* (2006.01)
(Continued)

(52) U.S. Cl.
CPC .......... *H01L 51/0078* (2013.01); *C09K 11/06* (2013.01); *H01L 51/0077* (2013.01);
(Continued)

(58) Field of Classification Search
None
See application file for complete search history.

(56) References Cited

U.S. PATENT DOCUMENTS 7,897,962 B2    3/2011    Tanaka et al.
2012/0049168 A1    3/2012    Inbasekaran et al.
(Continued)

FOREIGN PATENT DOCUMENTS

DE    11 2005 003 290 T5    11/2007
DE    60 2004 008 472 T2    5/2008
(Continued)

OTHER PUBLICATIONS

Vera Reiland, "Chemie und Koordinationschemie von Bismuttrifluoracetat und verwandten Verbindungen," Dissertation (D386), University of Kaiserslautern 2000, along with an English abstract.
(Continued)

*Primary Examiner* — Gregory D Clark
(74) *Attorney, Agent, or Firm* — DLA Piper LLP (US)

(57) ABSTRACT

A method produces cross-linked hole-conducting electric layers by converting functionalized p-dopants. The functionalized p-dopants are organic metal complexes containing at least one central atom and organic ligands, wherein the central atom is selected from a metal of the groups 6-15 of the periodic table, and at least one of the organic ligands is selected from the following formulas I-V, in which E independently of one another is oxygen, sulfur, selenium, or $N(E_1)_x$, and each $R_v$ has at least one functionalizing group selected from the group $R_F$ including —OH, —COOH, —NH$_2$, —NHR', halogen, C2-C40-alkenyl, -dienyl, -alki-
(Continued)

nyl, -alkenyloxy, -dienyloxy, -alkinyloxy, acrylic acid, oxetan, oxiran, silane, acrylic acid, anhydride, and cyclobutane or consists of the groups, and $G=C(R_F)_u H_v F_w$ where $u+v+w=3$ and $n=1-4$.

19 Claims, 2 Drawing Sheets

(51) Int. Cl.
    *C09K 11/06*     (2006.01)
    *H01L 51/52*     (2006.01)

(52) U.S. Cl.
    CPC ........ *H01L 51/506* (2013.01); *H01L 51/5092* (2013.01); *H01L 51/5203* (2013.01); *H01L 51/5056* (2013.01); *H01L 51/5088* (2013.01)

(56) References Cited

U.S. PATENT DOCUMENTS

| | | |
|---|---|---|
| 2012/0238774 A1 | 9/2012 | Hayashi et al. |
| 2014/0231795 A1 | 8/2014 | Otsuki et al. |
| 2015/0123047 A1 | 5/2015 | Maltenberger et al. |
| 2016/0122605 A1 | 5/2016 | Hayashi |
| 2017/0098787 A1 | 4/2017 | Maltenberger et al. |
| 2017/0317288 A1 | 11/2017 | Schmid et al. |
| 2018/0198069 A1 | 7/2018 | Schmid et al. |

FOREIGN PATENT DOCUMENTS

| | | | | |
|---|---|---|---|---|
| DE | 10 2010 027 316 A1 | 1/2012 | | |
| DE | 10 2010 041 331 | 3/2012 | | |
| DE | 10 2012 209 520 A1 | 12/2013 | | |
| DE | 10 2012 209 523 A1 | 12/2013 | | |
| DE | 20 2014 106 226 U1 | 10/2015 | | |
| DE | 10 2014 210 412 A1 | 12/2015 | | |
| DE | 10 2014 114 231 A1 | 3/2016 | | |
| EP | 2 772 956 A1 | 9/2014 | | |
| JP | 2013-110386 A | 6/2013 | | |
| JP | 2013-536984 A | 9/2013 | | |
| JP | 2015-526882 A | 9/2015 | | |
| JP | 2017-519861 A | 7/2017 | | |
| WO | 2010/066245 A1 | 6/2010 | | |
| WO | 2013/156125 A1 | 10/2013 | | |
| WO | 2013/182389 A2 | 12/2013 | | |
| WO | 2015/018539 A1 | 2/2015 | | |
| WO | WO 2015018539 | * | 2/2015 | ............. C09K 11/06 |
| WO | 2016/030330 A1 | 3/2016 | | |
| WO | WO 2016030330 | * | 3/2016 | ............. H01L 51/50 |

OTHER PUBLICATIONS

Vera Reiland, "Chemie und Koordinationschemie von Bismuttrifluoracetat und verwandten Verbindungen (Chemistry and Coordination Chemistry of bismuth trifluoroacetate and related compounds)," Dissertation (D386), University of Kaiserslautern 2000 (English Abstract).

Bo Li, "Heterometallic Carboxylates Incorporating Bismuth", Ph.D. Thesis, (K18B23), University of Albany, State University of New York, Chair M. Petrukhina 2007, UMI No. 3277252.

D.V. Solov'ev et al., "Fluorine-containing 2,3-Epoxypropyl Ethers. Synthesis and Spectral Characteristics", *Journal of general chemistry of the U.S.S.R.*, vol. 61, No. 3, 1991, pp. 611-615.

V.V. Sharutin, et al., "Synthesis and Structure of Triphenylbismuth Bis(Fluorobenzoates)", *Russian Journal of Coordination Chemistry*, vol. 29, No. 7, 2003, pp. 496-501.

Notice of Reasons for Rejection dated Dec. 17, 2019, of counterpart Japanese Application No. 2018-562565, along with an English Translation.

Notice to File a Response dated Feb. 13, 2020, of counterpart Korean Application No. 10-2019-7001368, along with an English Translation.

Vera Reiland, "Chemie und Koordinationschemie von Bismuttrifluoracetat und verwandten Vergindungen," Dissertation (D386), University of Kaiserslautern 2000.

Vera Reiland, "Chemie und Koordinationschemie von Bismuttrifluoracetat und verwandten Vergindungen (Chemistry and Coordination Chemistry of bismuth trifluoroacetate and related compounds)," Dissertation (D386), University of Kaiserslautern 2000 (English Abstract).

V.V. Sharutin et al., "Synthesis and Structure of Bismuth Tris(3-Methylbenzoate)[Bi(O$_2$CC$_6$H$_4$CH$_3$-3)$_3$]∞ and Phenylbismuth Bis(3,4,5-Trifluorobenzoate) [PhBi(μ-O$_2$CC$_6$H$_2$F$_3$-3,4,5)(O$_2$CC$_6$H$_2$F$_3$-3,4,5)]$_2$," Russian Journal of Coordination Chemistry, vol. 30, 2004, pp. 309-313.

EV Dikarev et al., "Rational syntheses, structure, and properties of the first bismuth(II) carboxylate," Inorganic Chemistry, vol. 43, No. 11, May 31, 2004, pp. 3461-3466 (Abstract).

Ravi Kumar Cheedarala et al., "Facile Synthesis of Second-Generation Dendrons with an Orthogonal Functional Group at the Focal Point," Synthetic Communications, vol. 39, No. 11, 2009, pp. 1966-1980 (Abstract).

A. Obreza et al., "Crystal Structures of 4-(Oxiran-2-Ylmethoxy) Benzoic Acid and 4-Acetoxybenzo c Acid," Journal of Structural Chemistry, vol. 53, No. 4, 2012, pp. 793-799.

* cited by examiner

CROSSLINKING P-DOPANTS FOR P-DOPING ORGANIC HOLE CONDUCTORS

TECHNICAL FIELD

This disclosure relates to a method of producing crosslinked, hole-conducting electrical layers, a crosslinked, hole-conducting electrical layer and an organic electronic component comprising a crosslinked, hole-conducting electrical layer.

BACKGROUND

The most commercially important components of the organic electronics are today essentially obtained by two different manufacturing processes. On the one hand, wet processes are used in which organic layers are formed by deposition from a solution using various printing techniques such as ink jet, gravure printing, offset printing, spin or slot coating. On the other hand, deposition of the layers can take place out of the gas phase by sublimation, i.e., thermal evaporation in a vacuum. Sublimation is used to fabricate the most efficient, commercially available organic devices such as organic light-emitting diodes, solar cells, transistors, and bipolar transistors. The efficiency of those components is also achieved, among other things, by the fact that they are made up of a large number of individual layers, each of the layers having a specific electrical function which is also related to the location in the component.

Organic components produced by solvent processes currently have a much lower complexity in the structure. This is due to the process due to the requirement that a deposited organic layer may not be dissolved in further processing steps by the following organic solvents. To do justice to this boundary condition, it is safest to work with orthogonal solvents (i.e., not miscible with the previous solvent) in the further process so that underlying layers are not dissolved again. That procedure limits the number of usable solvents and the number of processable organic substances and thus limits the possibility of an electrical fine adjustment of wet processable layer sequences.

While the above-mentioned boundary conditions apply to the production of any electrically functional, that is to say blocking, n- or p-conducting, emitting organic layer in organic components, in particular the production of highly efficient and long-lasting p-conducting, i.e., hole-conducting, layers is challenging. This in view of the process conditions to be met and selection of suitable compounds, which must show just that high functionality at the same time long service life of the components constructed thereof.

p-doping by organic metal complexes, both by vacuum and wet processes, is described, for example, in DE 102012209523. However, the problem of eluviation or segregation of the dopants remains unresolved in this application.

It could therefore be helpful to provide a method that increases conductivity of hole-conducting electrical layers by using functionalized p-dopants and optionally functionalized hole conductors and at the same time generates a crosslinked, stable layer protected against eluviation, segregation or entry of substances from outside the layer.

SUMMARY

We provide a method of producing crosslinked, hole-conducting electrical layers by a reaction of functionalized p-dopants, wherein the functionalized p-dopants are organic metal complexes comprising at least one central atom and organic ligands, wherein the at least one central atom is selected from a metal of groups 6-15 of the Periodic Table and at least one of the organic ligands is selected from formulas (I)-(V):

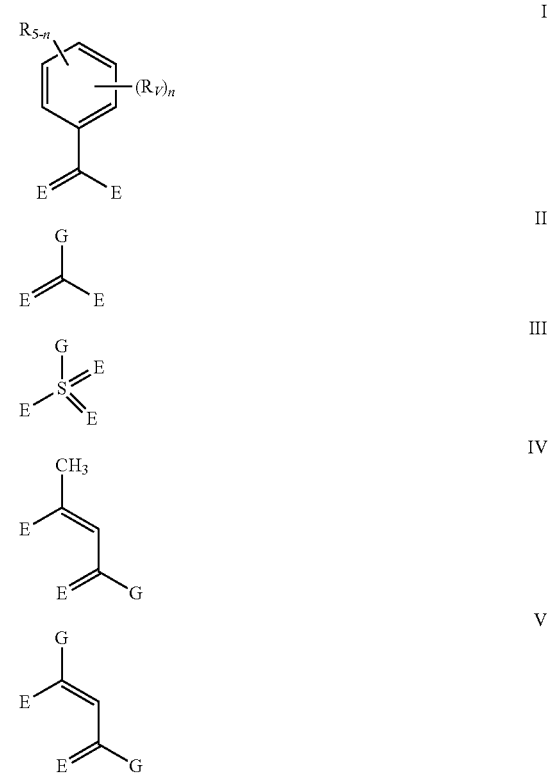

wherein E is, independently from each other, oxygen, sulfur, selenium or $N(E_1)_x$, $E_1$ is independently from each other selected from the group comprising H, D, substituted or unsubstituted alkyl or aryl and x=0, 1 or 2; R are independently from each other are H, D, F, C1-C20 branched and unbranched substituted or unsubstituted alkyl or aryl; $R_v$ are independently from each other selected from the group consisting of substituted or unsubstituted aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl; and each $R_v$ is at least one functionalizing moiety selected from the group $R_F$ comprising —OH, —COOH, —NH$_2$, —NHR', halogen, C2-C40-alkenyl, -dienyl, -alkynyl, -alkenyloxy, -dienyloxy, -alkynyloxy, acrylic acid, oxetane, oxirane, silane, acrylic acid, anhydride and cyclobutane, or consists thereof; wherein R' is a C1-C20 branched, unbranched, substituted or unsubstituted alkyl or aryl; $G=-C(R_F)_U H_V F_W$ with u+v+w=3; and n=1-4.

We also provide a method of producing crosslinked, hole-conducting electrical layers by reaction of functionalized p-dopants, wherein the functionalized p-dopants are organic metal complexes comprising at least one central atom and organic ligands, the central atom is selected from a metal of groups 6-15 of the Periodic Table and at least one of the organic ligands is selected from formulas (I)-(V):

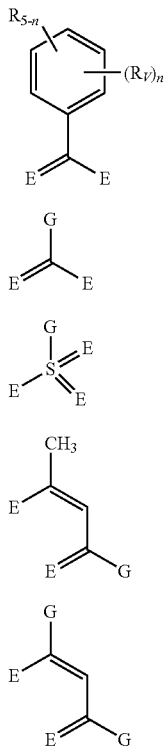

wherein E is, independently from each other, oxygen, sulfur, selenium or $N(E_1)_x$, $E_1$ is independently from each other selected from the group consisting of H, D, substituted or unsubstituted alkyl or aryl and x=0, 1 or 2; R are independently from each other are H, D, F, C1-C20 branched and unbranched substituted or unsubstituted alkyl or aryl; $R_v$ are independently from each other selected from the group comprising substituted or unsubstituted aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl; and each $R_v$ is at least one functionalizing moiety selected from the group $R_F$ comprising —OH, —COOH, —NH₂, —NHR', halogen, C2-C40-alkenyl, -dienyl, -alkynyl, -alkenyloxy, -dienyloxy, -alkynyloxy, acrylic acid, oxetane, oxirane, silane, acrylic acid, anhydride and cyclobutane, or consists thereof; R' is a C1-C20 branched, unbranched, substituted or unsubstituted alkyl or aryl; G=—C($R_F$)$_U$H$_V$F$_W$ with u+v+w=3; and n=1-4, the functionalized p-dopants are reacted and cross-linked with each other and the functionalized p-dopants are substituted with different moieties $R_F$, the one p-dopants have an epoxide or oxetane group as $R_F$ within $R_v$ or G and the other p-dopants have an NH₂-group or an NHR'-group as $R_F$ within $R_v$ or G; or the functionalized p-dopants are reacted with functionalized hole conductors and the functionalized hole conductors also have at least one moiety selected from the group $R_F$ or $R_v$, the functionalized p-dopants have an epoxide or oxetane group as $R_F$ within Rv or G and the functionalized hole conductors have at least one NH₂-group and/or NHR'-group within the group $R_F$ or $R_v$; or the functionalized p-dopants are reacted with functionalized hole conductors and the functionalized hole conductors also have at least one moiety from the group $R_F$ or $R_v$, and the functionalized p-dopants have an NH₂-group and/or NHR'-group as $R_F$ within $R_v$ or G and the functionalized hole conductors have an epoxide or oxetane group within the group $R_F$ or $R_v$.

Figure 1:
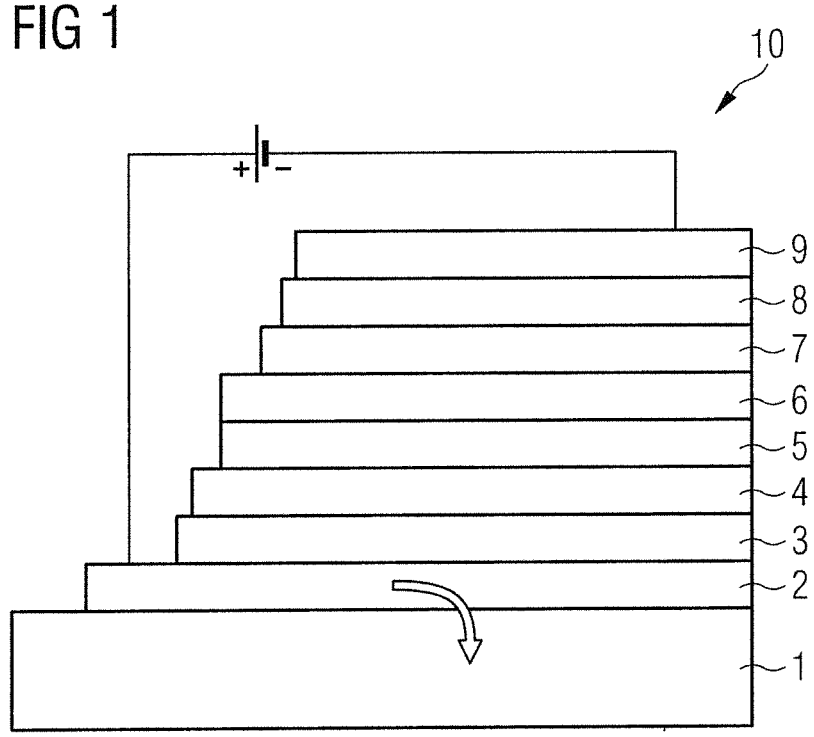
FIG. 1 shows a schematic side view of an example of an organic light-emitting diode.

LIST OF REFERENCE SIGNS 1 substrate
2 anode
3 hole-injecting layer
4 crosslinked, hole-conducting electrical layer
5 light-emitting layer
6 hole blocking layer
7 electron transporting layer
8 electron injecting layer
9 cathode
10 organic light-emitting diode
20 organic solar cell with PIN structure
21 light
22 anode
23 crosslinked, hole-conducting electrical layer
24 absorption layer
25 doped electron transporting layer
26 cathode
30 organic field effect transistor
31 substratum
32 Gate electrode
33 Gate dielectric
34,35 Source and drain contact
36 organic semiconductor layer
37 crosslinked, hole-conducting electrical layer

DETAILED DESCRIPTION

Our method produces crosslinked, hole-conducting electrical layers. This involves the reaction of functionalized p-dopants. The functionalized p-dopants can crosslink with each other by a chemical reaction and/or crosslink with functionalized hole conductors. Crosslinking means formation of covalent bonds between the functionalized p-dopants with each other and/or between the functionalized p-dopants and the functionalized hole conductors.

The functionalized p-dopants may comprise organic metal complexes. The metal complexes comprise at least one metal as the central atom and organic ligands. The central atom is selected from a metal of groups 6-15 of the Periodic Table. At least one organic ligand is selected from a group comprising ligands of formulas (I)-(V):

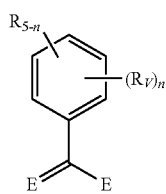

I

-continued

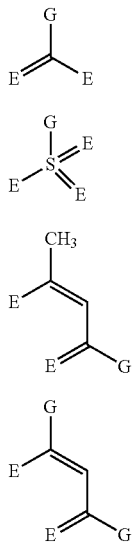

wherein

E are independently from each other oxygen, sulfur, selenium or N(E$_1$)$_x$, wherein E$_1$ is independently from each other selected from the group comprising H, D, substituted or unsubstituted alkyl or aryl and x=0, 1 or 2;

R are independently from each other H, D, F, C1-C20 branched and unbranched, substituted or unsubstituted alkyl or aryl;

R$_\nu$ are independently from each other selected from the group comprising substituted or unsubstituted aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl and each R$_\nu$ is at least one functionalizing moiety selected from the group comprising —OH, —COOH, —NH$_2$, —NHR', halogen, C2-C40-alkenyl, -dienyl, -alkynyl, -alkenyloxy, -dienyloxy, -alkynyloxy, acrylic acid, oxetane, oxirane, silane, acrylic acid, anhydride and cyclobutane or consists of these moieties; wherein R'=C1-C20 is branched, unbranched, substituted or unsubstituted alkyl or aryl;

G=—C(R$_F$)$_u$H$_\nu$F$_w$ with u+v+w=3; and n=1-4.

R$_\nu$ may each be independently from each other selected from the group comprising substituted or unsubstituted C5-C20 aryl, C1-C20 alkyl, C1-C20 alkoxy, C3-C20 cycloalkyl, C5-C20 haloaryl, C5-C20 heteroaryl, C3-C20 heterocycloalkylenes, C4-C20 heterocycloalkyl, C5-C20-haloheteroaryl, C2-C20-alkenyl, C2-C20-haloalkenyl, C2-C20-alkynyl, C2-C20-haloalkynyl, ketoaryl, haloketoaryl, ketoheteroaryl, ketoalkyl, haloketoalkyl, ketoalkenyl, haloketoalkenyl and each R$_\nu$ may be at least one functionalizing moiety selected from the group R$_F$ comprising —OH, —COOH, —NH$_2$, —NHR', halogen, C2-C20-alkenyl, C3-C20-dienyl, C2-C20-alkynyl, -alkenyloxy, -dienyloxy, alkynyloxy, acrylic acid, oxetane, oxirane, silane, acrylic acid, anhydride and cyclobutane or consists of these moieties, wherein R'=C1-C20 is branched, unbranched, substituted or unsubstituted alkyl or aryl.

R$_\nu$ may each be independently from each other selected from the group comprising substituted or unsubstituted C5-C10 aryl, C1-C10-alkyl, C1-C10-alkoxy, C3-C10 cycloalkyl, C5-C10 haloaryl, C5-C10-heteroaryl, C3-C10 heterocycloalkylenes, C5-C10-heterocycloalkyl, C5-C10-haloheteroaryl, C2-C10-alkenyl, C2-C10-haloalkenyl, C2-C10-alkynyl, C2-C10-haloalkynyl, ketoaryl, haloketoaryl, ketoheteroaryl, ketoalkyl, haloketoalkyl, ketoalkenyl, haloketoalkenyl, and each R$_\nu$ may each be at least one functionalizing moiety selected from the group R$_F$ comprising —OH, —COOH, —NH$_2$, —NHR'-halogen, C2-C10-alkenyl, C3-C10-dienyl, C2-C10-alkynyl, -alkenyloxy, -dienyloxy, -alkynyloxy, acrylic acid, oxetane, oxirane, silane, acrylic acid, anhydride and cyclobutane or consists of these moieties.

Preferably, R$_\nu$ are each independently from each other selected from the group comprising substituted or unsubstituted C5-C10-aryl, C1-C10-alkyl, C1-C10-alkoxy, C3-C10-cycloalkyl, C5-C10-haloaryl, C5-C10-heteroaryl, C3-C10-heterocycloalkylenes, C5-C10-heterocycloalkyl, C5-C10-haloheteroaryl, C2-C10-alkenyl, C2-C10-haloalkenyl, C2-C10-alkynyl, C2-C10-haloalkynyl, and each R$_\nu$ is at least one functionalizing moiety selected from the group R$_F$ comprising —OH, —COOH, —NH$_2$, NHR', halogen, C2-C10-alkenyl, C3-C10-dienyl, C2-C10-alkynyl, -alkenyloxy, -dienyloxy, -alkynyloxy, acrylic acid, oxetane, oxirane, silane, acrylic acid, anhydride and cyclobutane or consists of these moieties.

The functionalized p-dopants may be reacted with each other. This means that the functionalized p-dopants crosslink with each other and thus covalent bonds between the functionalized p-dopants are formed. In particular, the covalent bonds are formed between the moieties R$_\nu$ or R$_F$. At least two functionalized p-dopants can crosslink with each other. For example, 3 to 10 or 10 to 100 functionalized p-dopants crosslink with each other, in other words, the network formed is composed of 3 to 10 or 10 to 100 monomer units.

The functionalized hole conductors likewise may have at least one moiety from the group of R$_\nu$ or from the group of R$_F$. The functionalized p-dopants may be reacted with the functionalized hole conductor, that is to say that the functionalized p-dopants crosslink with the functionalized hole conductors. This forms covalent bonds between the functionalized p-dopants and the functionalized hole conductors. In particular, the covalent bonds are formed between the moieties R$_\nu$ or R$_F$. For example, 3 to 10 or 10 to 100 functionalized p-dopants and functionalized hole conductors crosslink with each other, in other words, the network formed is composed of 3 to 10 or 10 to 100 monomer units. In addition, the functionalized p-dopants can also crosslink with one another and thus form covalent bonds with one another.

We surprisingly found that this process leads to mechanically very stable and chemically inert, organic electrical layers without having to do without the standard production processes of organic electronics. By using the modified p-dopants or the modified p-dopants and the modified hole conductors, therefore, not only more stable layers are obtainable which, for example, show a lower tendency to crystallize and thus an extended service life, but rather can also be realized a significantly larger number of possible process steps. This is due to the fact that a crosslinked layer is chemically and physically more stable compared to a non-crosslinked layer. This applies in particular to wet processes in which further layers are deposited as part of a layer composite after the construction of a layer. Usually, deposition of the further layers requires a strict selection of the solvents for the processing of the further layers to avoid the dissolution or partial dissolution of the first deposited layer(s), whole or individual constituents thereof.

This restriction in the selection of the following solvents is eliminated by our method and therefore a much larger selection of solvents can be used when depositing the further layers, which need not necessarily to be orthogonal. A washing out of dopants or even a detachment of matrix components such as hole conductors is therefore no longer possible. As a result, chemically very well-defined organic electrical layers with a constant doping ratio are obtainable. Similar advantages also arise in the production of layers by vacuum methods. By virtue of the chemically and physically inert layers, diffusion from the constituents of one layer into another layer is significantly minimized, if not completely prevented. In this way unwanted defects are avoided by layer external substances in other layers. A further advantage of the process results from the fact that the crosslinking reaction can be controlled to a high degree because the individual reaction partners were chemically modified before they were deposited. Thus, chemically well-defined reaction partners, i.e., the functionalized p-dopants or the functionalized p-dopants and the functionalized hole conductors, meet, which contributes to a homogeneous process control and a controllable reaction. This is in contrast to reaction guides in which the cross-linking species are formed in situ only after deposition in a layer. In addition, the use of chemically defined crosslinking agents (p-dopant or p-dopant and hole conductor) makes it possible to provide a defined layer structure. So far, conventional deposition processes result in less fixed attachment of the reaction partners and, thus, in a more or less fixed arrangement of p-dopants with one another or p-dopant and hole conductors within the layers. By using functionalizing groups at defined positions of the p-dopants or the p-dopants and the hole conductor, a direct spatial relationship between the individual reaction partners can be specified. In this way, the structural arrangement of the layer can be predicted. Thus, not only longer-lasting, but also structurally determinable layers can result. This can contribute to improved or even changed functionality of the layer.

Functionalized p-dopants may be crosslinked with one another. The functionalized p-dopants crosslink with each other through a chemical reaction, forming a network. In particular, starting at a concentration of 16 percent by volume of the p-dopant based on the volume of the hole conductor, cross-linking of the p-dopants among each other is surprisingly sufficient to form a mechanically very stable and chemically inert cross-linked hole-conducting electrical layer. The hole conductor is enclosed in the network so to speak. Thus, a functionalization of the hole conductors may not be necessary so that conventional, in particular non-functionalized, hole conductors can be used.

The substituent or substituents R may be selected independently from each other from the abovementioned group, wherein, in particular when R is a substituted or unsubstituted alkyl or aryl group, the substitution preferably may consist of a partial or perfluorination of the alkyl or aryl group. This substitution can contribute to a particularly suitable electronic structure of the moiety with which one is able to tune through the Lewis acidity of the entire complex.

The p-dopant or the p-dopant and the hole conductor carry a functionalizing moiety from the group of $R_F$, which may be identical or different. For the p-dopant, this functionalizing moiety from the group of $R_F$ carries at least one organic ligand $R_V$ or the group G. The functionalizing moieties are each covalently linked to the ligand $R_V$, the group G of the dopant or the hole conductor. It is also possible that the moiety $R_V$ consists of the moiety $R_F$. Of course, in the event that the p-dopant carries multiple ligands with moieties $R_V$ or groups G, the p-dopant will have multiple functionalizing moieties $R_F$ since each of the ligands will then carry such a functionalizing moiety. The functionalizing moieties of the p-dopant or of the p-dopant and the hole conductor are appropriately selected so that the functionalizing moieties can also form a covalent bond with one another. The appropriate combinations of suitable functionalizing moieties are known. In particular, it has been shown in the group of $R_F$ specified here that they are chemically compatible with the common hole conductors of organic electronics and the p-dopants which can be used. These functionalizing moieties of group $R_F$ can also be processed by the standard production methods without leading to a premature reaction of the functionalizing groups. In addition, the reaction between the moieties is carried out quantitatively to a high degree and at a reaction rate which allows efficient production. Without being bound by theory, these properties arise precisely through the attachment of the functionalized moiety to our employable ligands according to formulas I-V. This linkage of the functionalizing moiety to the complex results in both the crosslinking reaction being controllable to a high degree and also that the function as a p-dopant is not impaired. Such an effect cannot be expected if the attachment of the functionalizing moiety takes place to other than the ligands provided here. Without being bound by theory, the suitability of the ligands I-V which can be used in this process results from a combination of the steric and electronic properties chosen. In particular, the spatial proximity of the functionalizing, crosslinking group to the group that takes over the coordination to the metal central atom (E), seems to exert a favorable influence, both on the complex formation as well as on the crosslinking reaction. This effect is most likely attributable to the direct spatial proximity of these groups or to a resonance-stabilizing bond between these two groups. Furthermore, the group of ligands which can be used is highly suitable for giving very stable complexes with the metal atoms of groups 6-15 which can be used, wherein this group of ligands additionally enables a suitable electronic interaction with the metal central atom. Without being bound by theory, the electronic interaction between our employable ligands and the metals go beyond a pure complex formation so that also a redistribution of electron density (or further electronic interaction mechanisms) from the metals to the ligands takes place. This is probably due to a suitable size and Lewis acidity of the metal group referred to herein and the appropriate steric and electronic design of the organic ligands set forth herein. It is therefore a tailor-made combination of suitable Lewis acids (function of p-type doping) with suitable Lewis bases (hole-conducting function), which in sum have good p-conducting, i.e., hole-conducting, layers and, if functionalized, good crosslinking properties.

The term "p-dopant" in particular comprises compounds always having at least one metal central atom of groups 6-15 of the Periodic Table and one or more organic ligands according to formula I-V, wherein at least one of the organic ligands is functionalized, that is equipped for networking. The ligands are usually charged in the complex with the metal and thus compensate for the charge of the metal. The charge of the ligand in the complex is known and not discussed herein. It may happen, for example, for complexation with the metal atom, a hydrogen atom may be cleaved from the E of the ligand, for example, an OH group will become O". Furthermore, it is known that the E of the ligands can be present either single or double covalently bound to the ligand. The bonding conditions of E in the illustrated ligands are therefore to be understood as an example. The number of further covalent binding partners $E_1$ is understandable as a function of the binding of the E. For example, if E is formally singularly covalently bound to the ligand, for example —N, then of course two $E_1$ units can be attached to the nitrogen be bound —N$(E_1)_2$ or —N$(E_1)$H. However, if the nitrogen is doubly bound =N, then of course only one $E_1$ unit =N$E_1$ or one negative charge =N$^-$ is present.

The term "metal from groups 6-15 of the Periodic Table," in particular the metals of the 6th to 15th Group according to IUPAC, that is Cr, Mo, W, Mn, Tc, Re, Fe, Ru, Os, Co, Rh, Ir, Ni, Pd, Pt, Cu, Ag, Au, Zn, Cd, Hg, Al, Ga, In, Tl, Ge, Sn, Pb, As, Sb, Bi or mixtures thereof are understood. These metals provide a sufficient Lewis acidity and thus enable an effective p-doping of the hole conductor. Furthermore, these metals allow a particularly effective interaction with our employable ligands. These reaction possibilities do not show other metals outside of this group to that extent. Furthermore, it has been shown that these metals do not affect the reactions of our functionalized ligands. This is surprising for the reason that by changes in the electron density of the functional groups at least a greater influence of the metal atom on the reaction rate of the reaction of the functionalized ligands would have been expected among themselves or with the functionalized hole conductor.

Preference is furthermore given to the metals of group 14 and 15, that is to say silicon, germanium, tin, lead, arsenic, antimony, bismuth. The metals selected from the group comprising or consisting of Cu, Ag, Zn, Al, Sn, Sb, Bi are also preferred. Most preferably, the metal is bismuth.

The group G results in —C$(R_F)_uH_vF_w$ with u+v+w=3, wherein the individual placeholder u, v, w may represent integers from 0 to 3 and u is at least 1. In particular, the number of fluorine atoms can influence the Lewis acidity of the complex, which can contribute to an improved doping effect of the complex.

In principle, the hole conductors or hole conductor basic structures known to those skilled in the art are suitable as hole conductors, which are modified by the functionalization in the example of the use of a functionalized hole conductor. As hole conductors or hole conductor basic structures, for example, the following compounds, or mixtures of these compounds, are possible:

NPB (N,N'-bis (naphthalene-1-yl)-N,N'-bis(phenyl)-benzidine), β-NPB N,N'-bis(naphthalene-2-yl)-N,N'-bis(phenyl)-benzidine), TPD (N,N'-bis(3-methylphenyl)-N,N'-bis(phenyl)-benzidine), spiro TPD (N,N'-bis(3-methylphenyl)-N,N'-bis(phenyl)-benzidine), spiro-NPB (N,N'-bis(naphthalene-1-yl)-N,N'-bis(phenyl)-spiro), DMFL-TPD N,N'-bis(3-methylphenyl)-N,N'-bis(phenyl)-9,9-dimethyl-fluorene), DMFL-NPB (N,N'-bis(naphthalene-1-yl)-N,N'-bis(phenyl)-9,9-dimethyl-fluorene), DPFL-TPD (N,N'-bis(3-methylphenyl)-N,N'-bis(phenyl)-9,9-diphenyl-fluorene), DPFL-NPB (N,N'-bis(naphthalene-1-yl)-N,N'-bis(phenyl)-9,9-diphenyl-fluorene), spiro-TAD (2,2',7,7'-tetrakis(N,N-diphenylamino)-9,9'-spirobifluorene), 9,9-bis[4-(N,N-bis-biphenyl-4-yl-amino)-phenyl]-9H-fluorene, 9,9-bis[4-(N,N-bis-naphthalene-2-yl-amino)-phenyl]-9H-fluorene, 9,9-bis[4-(N,N'-bis-naphthalene-2-yl-N,N'-bis-phenyl-amino)-phenyl]-9H-fluorene, N,N'-bis(phenanthrene-9-yl)-N,N'-bis(phenyl)-benzidine, 2,7-bis[N,N-bis(9,9-spiro-bifluorene-2-yl)-amino]-9,9-spirobifluorene, 2,2'-bis[N,N-bis(biphenyl-4-yl)amino]9,9-spiro-bifluorene, 2,2'-bis(N,N-di-phenyl-amino)-9,9-spiro-bifluorene, Di-[4-(N,N-ditolyl-amino)-phenyl]cyclohexane, 2,2',7,7'-tetra(N,N-di-tolyl)amino-spiro-bifluorene, N,N,N',N'-tetra-naphthalene-2-yl-benzidine.

These compounds can be used in addition to their use as monomers in oligomeric or polymeric form. Preferably, then, the oligomers or polymers may have a molecular weight of greater than or equal to 300 Da and less than or equal to 500,000 Da, further greater than or equal to 3,000 Da and less than or equal to 100,000 Da. Thus, for example, the abovementioned hole conductor basic structures in this molecular weight range have proven to be particularly suitable and have proved to be accessible for crosslinking. The molecular weight of the organic hole conductor can be obtained by the usual methods for molecular weight determination. At this point, the weight-average molecular weight is listed, which can be determined, for example, by GPC, viscometry or other rheological methods. Furthermore, light scattering is also suitable for determining the molecular weight. In differences between the methods mentioned, the value determined by scattering methods should be decisive.

The basic structures of the hole conductors may show the functionalizing group $R_F$ or the group $R_v$ at each substitutable site of their basic structure. In principle, it is also possible that these basic structures have more than one functionalizing group. In particular, it may be advantageous for the hole conductor to be formed from monomers, the ratio of crosslinking groups to monomers being 0.0001-2, preferably 0.001-1, furthermore preferably 0.01-1. The ratio indicates the number of functionalized monomers. At a ratio of 0.01, every 100th of monomer in the deposited hole conductor carries a crosslinkable group, and at a ratio of 1, each monomer within the hole conductor has a crosslinkable group. By these conditions layers with a suitable processability and viscosity can be produced. In particular, a higher functionalization may be suitable to form defined three-dimensional layer structures whose final degree of hardness can easily be controlled by the number of crosslinking sites.

The functionalized p-dopants can react with one another and/or the functionalized p-dopants can react with the functionalized hole conductors after deposition in a layer after application by the common methods of chemistry, that is, be reacted with each other. The crosslinking groups can trigger radical, ring-opening or condensating crosslinking reactions. The reaction of the two reactants can be carried out both spontaneously by direct reaction of the two reactants within the layer, by an external impulse or else by addition of a starter reagent. Possible impulses are, for example, heating, irradiation with light of different wavelengths or X-rays, or any other impulses. The choice of the external start impulse results here as a function of the chemistry of the functionalizing groups and is known.

The p-dopants may be substituted with different moieties $R_F$ being suitable for crosslinking. For example, the p-dopants within the group $R_v$ or G have as $R_F$ an epoxide (oxirane) or oxetane group. The other p-dopants may then within the group $R_v$ or G have as $R_F$ an amine group, for example, a primary or secondary amine. The amines can be aliphatic or aromatic. Aromatic amines are preferred because they are less prone to cure at room temperature than aliphatic amines.

The functionalized p-dopants may be reacted with one another and crosslinked and the functionalized p-dopants are substituted with different moieties $R_F$, wherein the one p-dopants have an epoxide or oxetane group as $R_F$ within $R_V$ or G and the other p-dopants have an $NH_2$-group or NHR' as $R_F$ within $R_v$ or G.

For example, $R_v$ can have a terminal amino group and thus serve as crosslinker for at least one epoxide or oxetane group-containing p-dopant. In an addition reaction, a crosslinked layer is thus obtained which results from the addition of the amino group of the p-dopant and the epoxide or oxetane groups of the p-dopant. In addition, an anionic polymerization reaction of the epoxide or oxetane groups themselves and, thus, a further crosslinking takes place under the influence of the amino groups. If $R_v$ contains a secondary amine with only one H atom, this unit can only react with one epoxide or oxetane group of one $R_v$ of another p-dopant.

For example, Rv can have a terminal amino group and thus serve as a crosslinker for a monomeric, oligomeric or polymeric hole conductor containing at least two epoxide or oxetane groups (see Scheme I below for epoxide groups). In an addition reaction, the following crosslinked layer is thus obtained, which results from the addition of the amino group of the p-dopant and of the epoxide or oxetane groups of the hole conductor. In addition, under the influence of the amino groups, an anionic polymerization reaction of the epoxide or oxetane groups themselves and thus further crosslinking takes place. Hole conductors usually contain triarylamine units, which may be catalytically active. If $R_v$ contains a secondary amine with only one H atom, this unit can only react with one epoxide or oxetane group of a hole conductor. In the scheme the reaction is shown with two groups.

Aromatic amines are preferred because they are less prone to cure at room temperature than some aliphatic amines.

Alternatively, the epoxide groups may be located on the p-dopant and the amine groups with free H atoms on the hole conductor. In addition, it is also possible to mix two or more p-dopants with amine-functionality and/or epoxide-functionality to achieve additional crosslinking even under the p-dopants. The same applies to the hole conductor.

The functionalized p-dopants may be reacted with functionalized hole conductors. The functionalized hole conductors also have at least one moiety from the group $R_F$ or $R_v$, wherein the functionalized p-dopants have an epoxy or oxetane group as $R_F$ within $R_v$ or G and the functionalized hole conductors have at least one $NH_2$ group and/or NHR' group within the group $R_F$ or $R_v$ or wherein the functionalized p-dopants have an $NH_2$ group and/or NHR' group as $R_F$ within $R_v$ or G and the functionalized hole conductors have an epoxide or oxetane group within the group $R_F$ or $R_v$.

Scheme 1

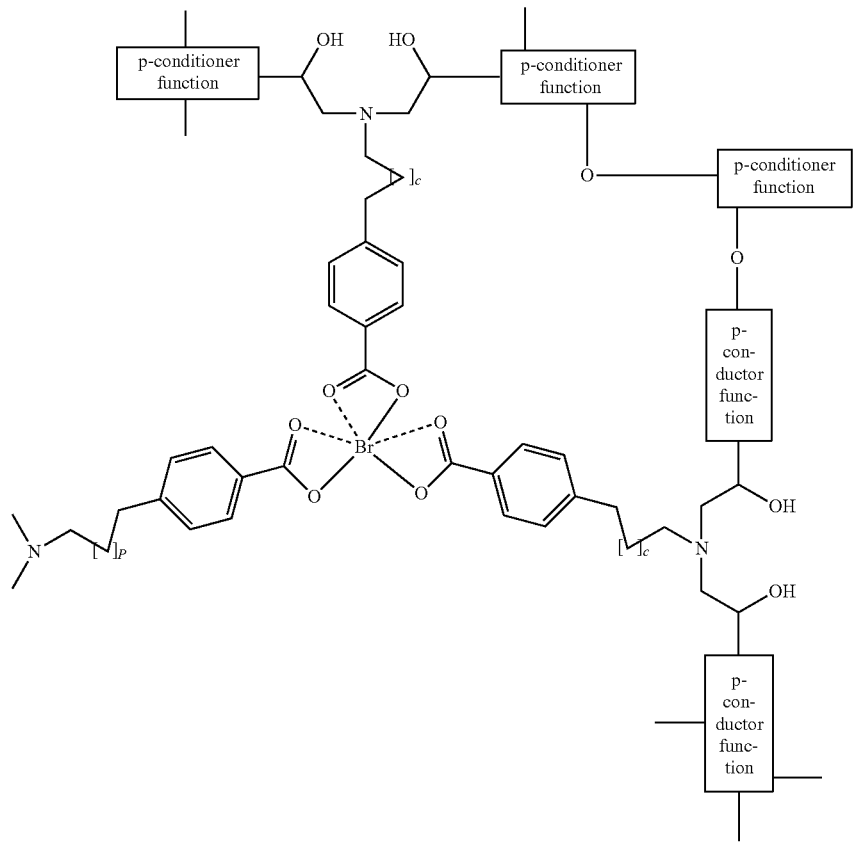

The p-dopants and/or the p-dopants and the hole conductor may be substituted with the same moieties $R_F$ suitable for crosslinking. For example, this is an epoxide group, an oxetane group or an amine group, for example, a primary or secondary aromatic or aliphatic amine. The crosslinking then takes place with the addition of an additional crosslinker. The crosslinker may be, for example, a compound functionalized with two amine groups when $R_F$ is an epoxide or oxetane group, and/or a compound functionalized with two epoxide or oxetane groups when $R_F$ is an amine group. Aromatic amines are preferred because they are less prone to cure at room temperature than aliphatic amines.

The p-dopants may be functionalized with an epoxide group and the hole conductor with an oxetane group or vice versa. The crosslinking then takes place with the addition of an additional crosslinker. The crosslinker may be, for example, a compound functionalized with two amine groups. Preferred are aromatic amines.

Within the definition of the p-dopant substituted or unsubstituted ligands are mentioned. In the event that these compounds are substituted, this means that they can have halogens, D, C1-C10 alkyls and substituted or unsubstituted heterocycles at each bondable site of the base body. The substituents can preferably be selected from heterocycles such as furan, thiophene, pyrrole, oxazole, thiazole, imidazole, isoxazole, isothazole, pyrazole, pyridine, pyrazine, pyrimidine, 1,3,6-triazine, pyrylium, alpha-pyrone, gamma-pyrones, benzofuran, benzothiophene, indole, 2H-isoindole, benzothiazole, 2-benzothiophenes, 1H-benzimidazoles, 1H-benzotriazoles, 1,3-benzoxazoles, 2-benzofuran, 7H-purines, quinoline, iso-quinoline, quinazolines, Quinoxalines, phthalazines, 1,2,4-benzotriazines, pyrido [2,3-d]pyrimidines, pyrido [3,2-d]pyrimidines, pteridines, acridines, phenazines, benzo[g]pteridines, 9H-carbazoles, bipyridine and their derivatives are selected. Derivatives also include in particular the fluorinated or deuterated variants of these compounds.

Preferably, the p-dopant, i.e., the metal complex, may comprise bismuth, tin, zinc, rhodium, molybdenum, chromium or copper as the central atom. In particular, this selection of metals shows a suitable Lewis acidity to, together with the functionalized ligands which can be used, enable both a fast and complete crosslinking reaction, as well as to induce a sufficient increase in the p-type conductivity in the crosslinked state. In a further example, the metal complex may comprise one or more metals from the group comprising Sn, Sb and Bi. These metals provide particularly good doping results and are available at reasonable prices.

Preferably, the metal complex may comprise bismuth, tin, zinc, rhodium, molybdenum, chromium or copper and at least one of the ligands of the p-dopant of the formula I corresponds. In particular, the ligands of the formula I may be suitable to form very stable complexes with the above-mentioned group of metals, which lead to an efficient p-doping of matrix materials. This ability is apparently not impaired by the introduction of the functionalizing moieties which can be used so that very well crosslinkable and electronically suitable p-dopants are obtained. Surprisingly, this is still the case, although the possibility of resonance stabilization would be expected to cause an interaction between the functionalizing group and the group which allows attachment to the metal atom. Each of the ligands of the metal complex of the p-dopant may correspond to formula I.

The p-dopant may have formula (A):

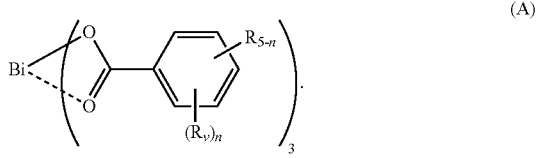

The compounds of formula (A) can be produced, for example, by the following reaction:

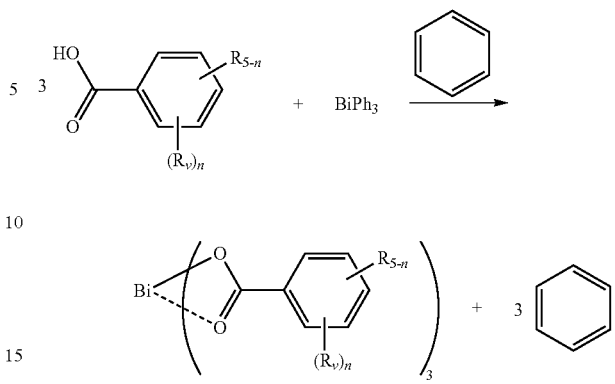

The reaction takes place in benzene. BiPh$_3$ is commercially available.

For example, the p-dopant has one of the following formulas (A1), (A2) or (A3):

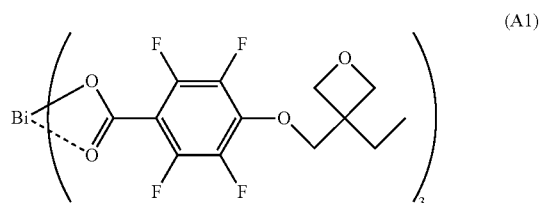

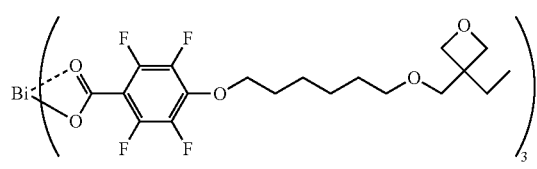

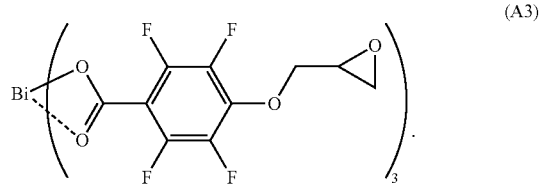

The metal complex may contain Zn, Cr, Cu or Mo and be present with the ligand as a so-called complex with paddle wheel structure ("paddlewheel complex"). These are preferably carboxylate complexes. Among the copper metal complexes, the Cu(II)-complexes in particular form paddle-wheel complexes, while Cu(I)-complexes are predominantly tetrameric, hexameric, or polymeric. In particular, this paddlewheel-complex geometry has proven to be particularly suitable in our method to geometric layer structures. Without being bound by theory, this is most likely due to the symmetric structure of the p-dopants. In addition, it seems that especially this structure is capable of greatly increasing the hole conductivity of the layers. Suitable paddlewheel structures are given, for example, in DE 10 2012 209520. These structures then have to have a ligand according to one of formulas I-V, which is functionalized.

At least one ligand of the p-dopant corresponds to formula (VII) or (VIII):

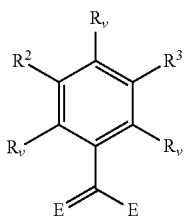

(VII)

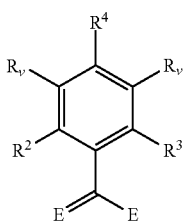

(VIII)

wherein
$R^2$ and $R^3$ or $R^2$, $R^3$ and $R^4$ are independently from each other selected from F and branched and unbranched substituted alkyl or substituted aryl. Preferably, $R^2$ and $R^3$ or $R^2$, $R^3$ and $R^4$ are independently from each other selected from F and branched and unbranched, substituted C1-C5 alkyls. $R^2$ and $R^3$ or $R^2$, $R^3$ and $R^4$ are preferably electron-withdrawing moieties. The fact that the moieties are electron-withdrawing moieties means that they subtract electron density from the aryl ring and thus have a higher electronegativity than the aryl ring. By the ligands of the formula VII or VIII crosslinked layers can be obtained which are both chemically very stable as well as highly p-conductive. This special structure of the ligand is suitable to ensure a very effective binding of the ligand to the metal central atom of the complex, without disturbing a subsequent crosslinking reaction with a further p-dopant or the hole conductor. Without being bound by theory, this is probably due to the fact that the electronic structure and steric expansion of the ligand allow effective resonance stabilization. This can facilitate the uptake of an electron by the p-dopant and an effective interaction with the hole conductor. In addition, these ligands form quite stable complexes with the metal atoms, which allows, for example, a non-decomposed sublimation of the p-dopants. Apparently, this type of ligand also appears to be capable of compensating for the crosslinking reaction with other p-type dopants or the hole conductor, even in the presence of the metal atom, thus allowing complete reaction of both functionalized species.

At least one of the ligands of the p-dopant may correspond to formula (VI):

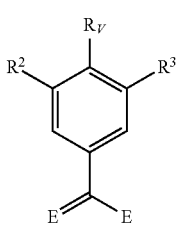

(VI)

wherein
R2 and R3 are independently from each other selected from F and branched and unbranched substituted or unsubstituted alkyl or substituted aryl. Preferably $R^2$ and $R^3$ or $R^2$, $R^3$ and $R^4$ are independently from each other selected from F and branched and unbranched, substituted or unsubstituted C1-C5 alkyl. $R^2$ and $R^3$ are preferably electron-withdrawing moieties. By the ligands according to formula VI, it is possible to obtain crosslinked layers which are both chemically very stable and highly p-conductive. This special structure of the ligand seems to be suitable to ensure a very effective binding of the ligand to the metal atom of the complex without disturbing a subsequent crosslinking reaction with the hole conductor. Without being bound by theory, this is probably due to the electronic structure and the steric expansion of the ligand effective resonance stabilization is possible. This can facilitate the uptake of an electron by the p-dopant and an effective interaction with the hole conductor. In addition, these ligands form quite stable complexes with the metal atoms which can be used, which, for example, makes possible a non-decomposed sublimation of the p-dopants. Apparently, this type of ligand also seems to be suitable to compensate the crosslinking reaction with further p-dopants or the hole conductor, even in the presence of the metal atom so that complete reaction of both functionalized species is made possible.

For example, the p-dopant has one of formulas (A4), (A5) or (A6):

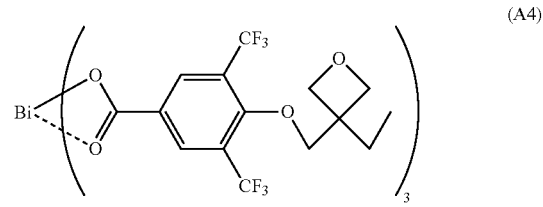

(A4)

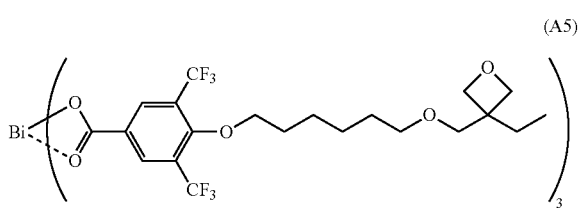

(A5)

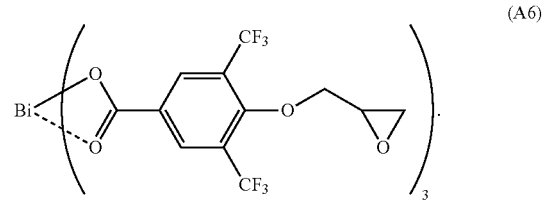

(A6)

$R^2$ and $R^3$ in the formulas VI, VII or $R^2$, $R^3$, $R^4$ in the formula VIII may be independently from each other selected from F and branched and unbranched at least mono, particularly preferred per-, halo-substituted C1-C20-alkyl, preferably independently from each other selected from F and the at least mono, more preferably per-, halogen-substituted C1-C5-alkyls. The halogens may be selected from a group comprising F, C1, Br and combinations thereof.

The metal complex may have one of the following structural cutouts:

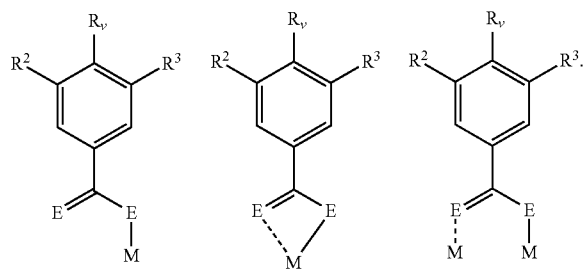

M represents, for example, bismuth, tin, zinc, rhodium, molybdenum, chromium or copper. The ligand can thus be bound to a metal central atom M within the metal complex via a covalent bond, or the ligand can be bound to a metal central atom M within the metal complex via a covalent bond and a coordinative bond, or the ligand can have one covalent bond to a metal central atom M and a coordinative bond to another metal central atom M. Analogous bonding conditions between E and M are also possible for the ligands of the formulas (VII) or (VIII).

The E from formulas (I)-(VIII) may be oxygen. Carboxylic acids or the carboxylates have been found in the context of our method to be particularly suitable to provide a stable p-dopant, which can be processed unchanged and is able to significantly increase the hole conductivity of hole conductors. The metal carboxylates, in particular with copper or bismuth as central atoms, have an outstanding doping strength and high optical transparency because of their Lewis acidity. The efficiency and service life of devices, especially organic light-emitting diodes comprising a crosslinked, hole-conducting layer with these functionalized p-dopants, has proved to be particularly high. In addition, such crosslinked, hole-conducting layers are inexpensive to produce. They are preferably benzoic acid ligands.

The metal complex may comprise bismuth, tin, zinc, rhodium, molybdenum, chromium or copper and at least one ligand of the p-dopant corresponds to formula (II). The linking unit between the coordination sites on the metal atom (the E) and the functionalizing moiety may preferably be designed as a short-chain alkyl, in this case as a single carbon atom (in the backbone). Optionally, this structure may also be fluorinated and, due to its steric configuration, appears to be capable of enabling both an effective attachment to the metal center and an effective crosslinking reaction in our process. Apparently, even a short backbone between the two groups mentioned above does not hinder the free mobility of the functionalizing moiety, so that the crosslinking reaction can also proceed efficiently.

Preferably, the metal complex may comprise bismuth, tin, zinc, rhodium, molybdenum, chromium or copper and at least one ligand of the p-dopant corresponds to the formula III. In addition to a skeleton of carbon atoms, it is also possible to use sulfur atoms which provide the connection between the coordinating group and the crosslinking group for the process. Surprisingly, we found that the sulfur also has a suitable electronic structure, which does both not hinder the subsequent crosslinking reaction and favorably influences the Lewis acidity of the metal atom.

The metal complex may comprise bismuth, tin, zinc, rhodium, molybdenum, chromium or copper and at least one ligand of p-dopant corresponding to formula (IV). This group of metals is capable of forming with the ligands of formula (IV) complexes that provide a suitable electronic structure to remove electron or electron density from the hole conductor. Furthermore, this property is impaired only to a very small extent by the presence of the functionalizing groups so that a rapid and complete crosslinking reaction between the p-dopants among each other and/or with the hole conductor can occur.

The metal complex may comprise bismuth, tin, zinc, rhodium, molybdenum, chromium or copper and at least one ligand and of the p-dopant corresponds to formula (V). It is also possible to couple a plurality of functionalizing groups to one ligand so that it can lead to a particularly highly cross-linked layer. This ligand explicitly provides several of these functionalizing groups. It is thus also possible to couple a ligand to a plurality of hole conductor molecules, which can lead to an increased electronic interaction between p-dopant and hole conductor.

The moieties $R^2$ and $R^3$ or G or $R^2$ and $R^3$ and $R^4$ can each be at least mono fluorinated. In particular, the fluorine substitution of $R^2$, $R^3$ or G or $R^2$ and $R^3$ and $R^4$ can contribute to a particularly efficient increase in the hole conductivity of the crosslinked layer. Without being bound by theory, this is most likely due to the fact that the substitution of the Lewis acidity of the entire p-dopant can be tuned so that a particularly efficient uptake of an electron or electron density from the hole conductor is obtained. This mechanism can thus contribute to an increase in the layer conductivity of the crosslinked layer. Without being bound by theory, this can be achieved in particular by the strong —I effect of the fluorine-substituted moieties $R^2$, $R^3$, $R^2$ and $R^3$ and $R^4$ or G.

Further preferably, the moieties $R^2$ and $R^3$ or G or $R^2$ and $R^3$ and $R^4$ can be perfluorinated. Preferably, $R^2$, $R^3$ or $R^2$ and $R^3$ and $R^4$=$CF_3$. The use of ligands with perfluorinated moieties $R^2$, $R^3$ or G or $R^2$ and $R^3$ and $R^4$ can lead to metal complexes which interact particularly well with hole conductors and, thus, are capable to contribute to a significant increase in the hole conductivity of the crosslinked layers. Without being bound by theory, this is most likely due to the electronegativity of the fluorine, which in the ligands shown is capable of markedly increasing the Lewis acidity of the complex. The increase of Lewis acidity leads to an increase in the hole conductivity of the organic electrical layer in the context of the layer structure and the crosslinking.

Each of the ligands may have a structure of formula (VI), (VII) or (VIII) and the R2 and R3 or R2 and R3 and R4 may each be selected independently of one another from the group of branched and unbranched, at least mono, particularly preferably per-, fluoro-substituted C1-C5-alkyls.

Within an additional aspect of this disclosure, the moieties $R_F$ or $R_v$ may comprise or consist of the following moieties Q1a to Q26c:

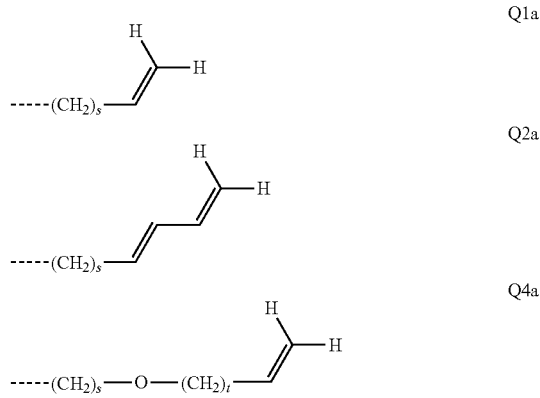

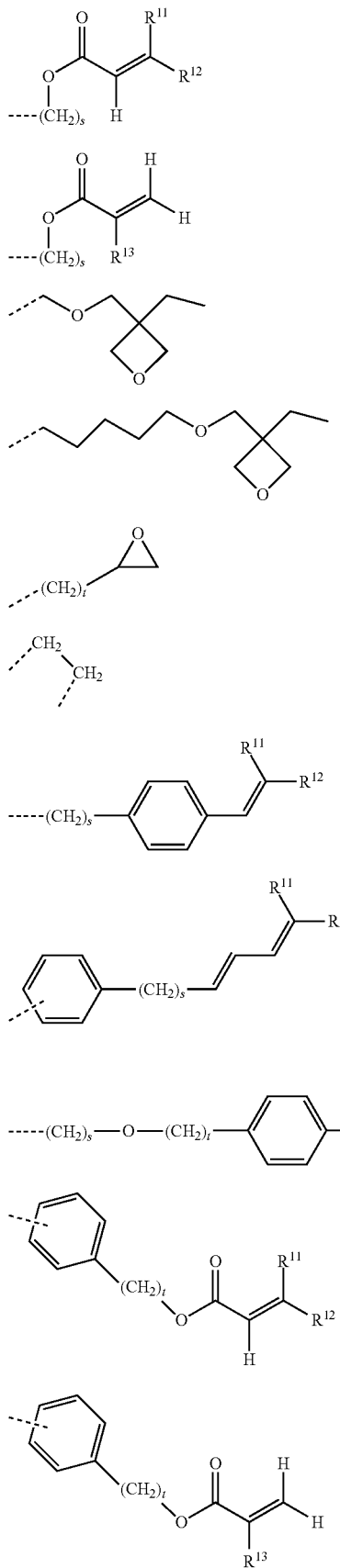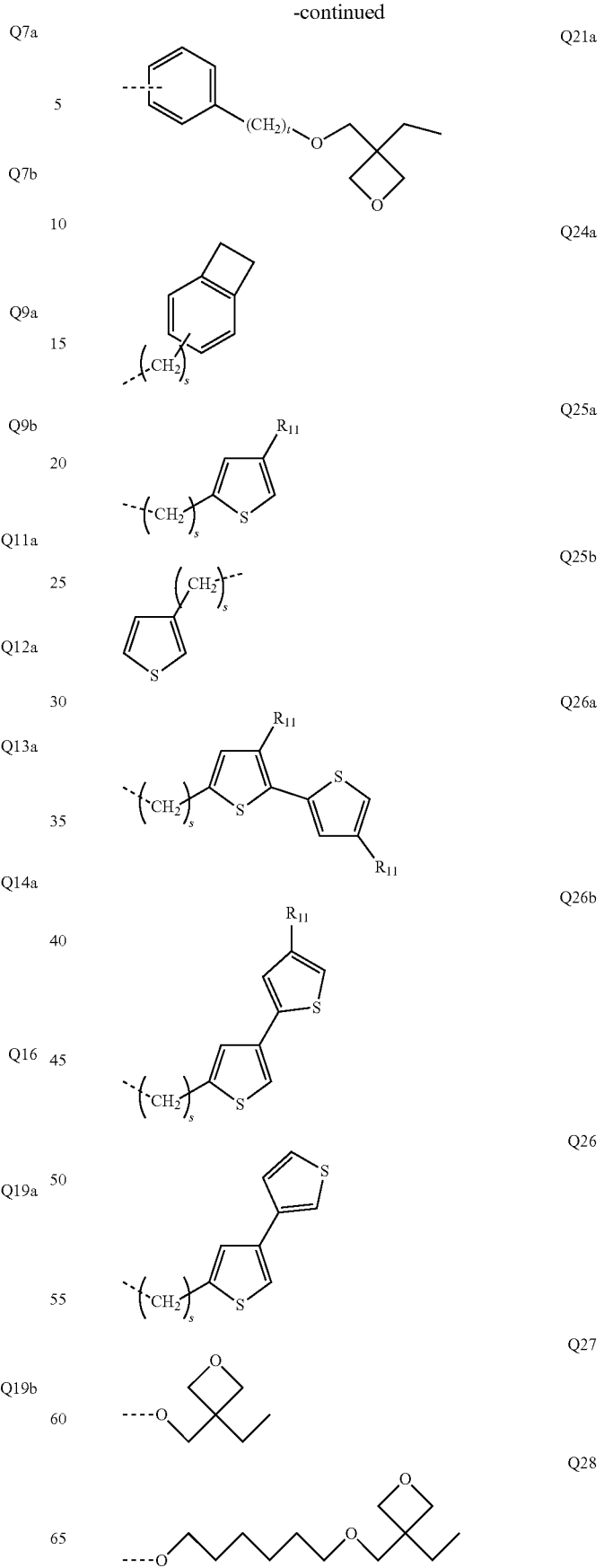

-continued

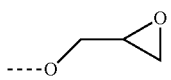
Q29 wherein the moieties $R^{11}$ and $R^{12}$ can be identical or different and are selected from the group comprising H, D or a straight-chain or branched C1-C6-alkyl, $R^{13}$ denotes a straight-chain or branched C1-C6-alkyl, s=0 to 8 and t=1 to 8. These functional moieties $R_F$ or $R_v$ can be coupled with the conventional methods of chemistry both to our employable ligands of the p-dopant as well as to our usable hole conductors. The result are functionalized ligands and functionalized hole conductors, which are highly temperature stable and which can be processed over a wide temperature range for this reason. This simplifies the process management within the layer structure and ensures that the functionalized moieties only react within the layer with the desired reaction partner. This can contribute to a more efficient crosslinking of the layer.

The moieties $R_F$ or $R_v$ can comprise or consist of the following moieties Q1b to Q26g:

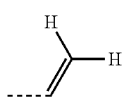
Q1b

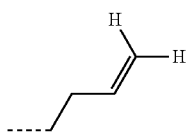
Q1c

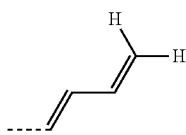
Q2b

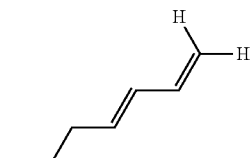
Q2c

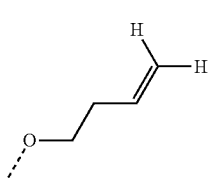
Q4b

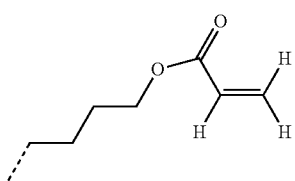
Q7c

-continued

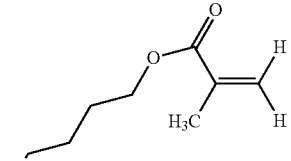
Q7d

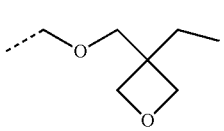
Q9a

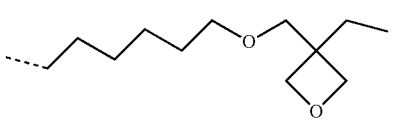
Q9b

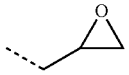
Q11b

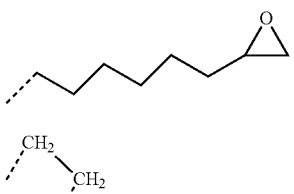
Q11c

Q12b

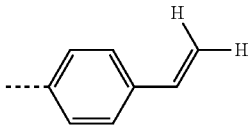
Q13b

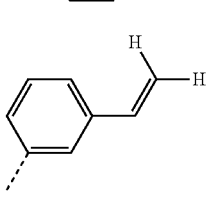
Q13c

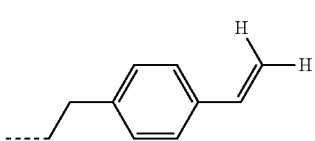
Q13d

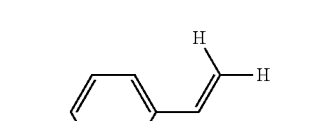
Q13e

Q14b

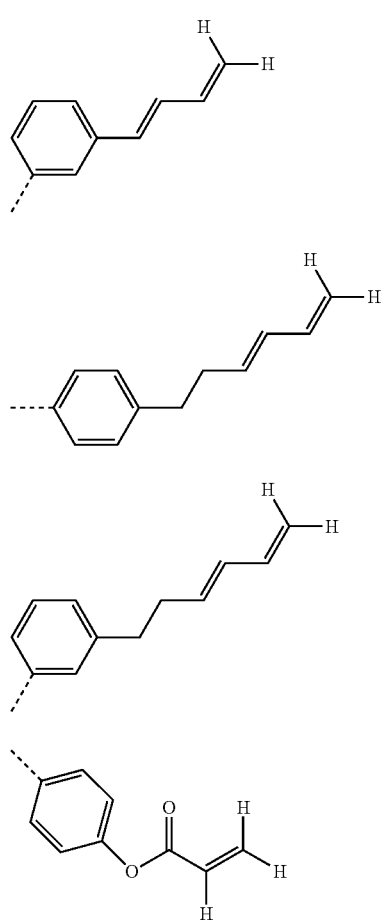
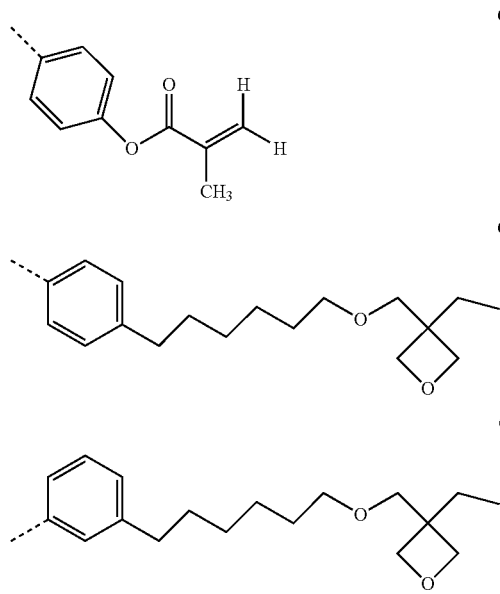
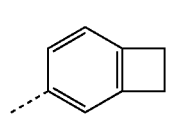
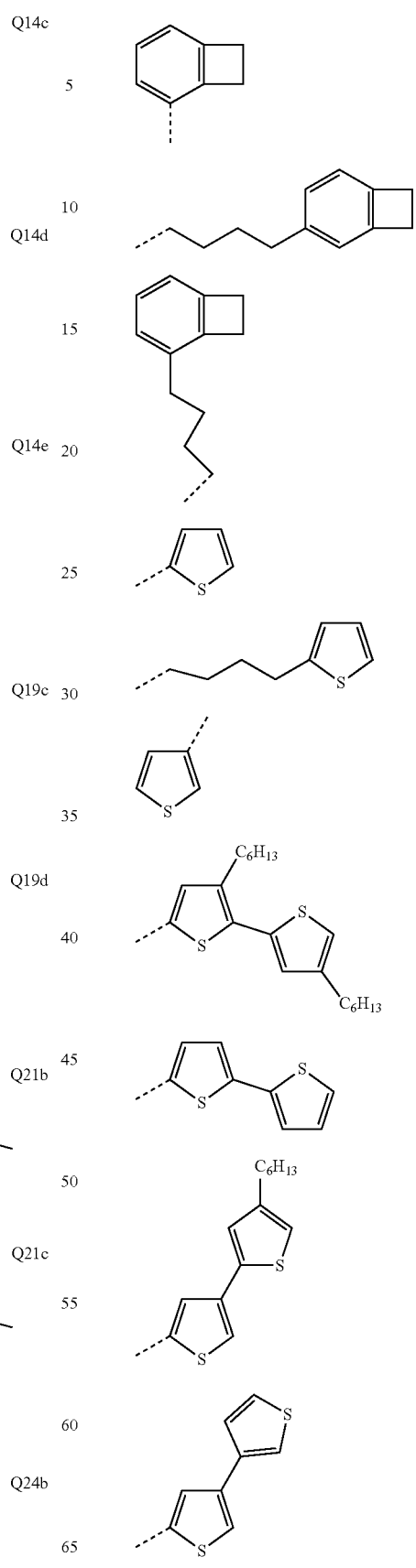

These functionalizing moieties exhibit a quantitative and very rapid reaction within the scope of the crosslinking reaction, wherein the covalent bridges between the functionalized p-dopants and/or between the functionalized p-dopants and the functionalized hole conductors do not seem to oppose an effective doping. The transfer of electrical charges from the p-dopant to the hole conductor is therefore not hindered by the covalent linkage. Therefore, it is possible to produce sufficient p-conductive layers with low concentrations of p-type dopants.

We also provide a method with a p-dopant or hole conductor, wherein an additional linker is arranged between the ligand or the hole conductor and the functionalizing moiety from the group $R_F$, wherein the linker is selected from the group comprising fluorinated or non-fluorinated C1-C20-, preferably C1-C10-alkyl, -alkenyl, -alkynyl, polyethylene glycol, polyethylenediamine, polyester, polyurethane, polyvinylidene-phenylene or mixtures thereof. The C1-C20 alkenyl groups may have conjugated or non-conjugated double bonds. The C1-C20 alkynyl groups may have conjugated or non-conjugated triple bonds and may be substituted, for example, with aromatics. The linkers mentioned may have aromatics or polyenes in their molecular chain. Within certain examples, it has been found useful to increase the distance between the functionalizing group $R_F$ and the ligand of the metal complex. Without being bound by theory, this results in the functionalized moiety is overall more mobile and a crosslinking reaction with another functionalized moiety is facilitated. In this way, both the reaction kinetics and the mechanical properties of the resulting crosslinked layer can be influenced. The selected group of linker compounds ensures a sufficient electrical interaction between the p-dopant and the hole conductor so that the effectiveness of the doping is not restricted.

The unit of functionalizing moiety and linker, especially the moiety $R_v$, can be selected from the group comprising Q13-Q26:

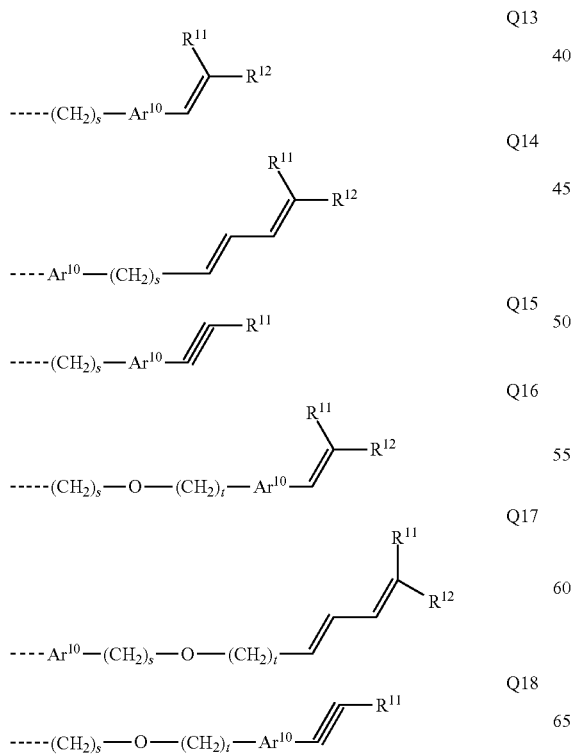
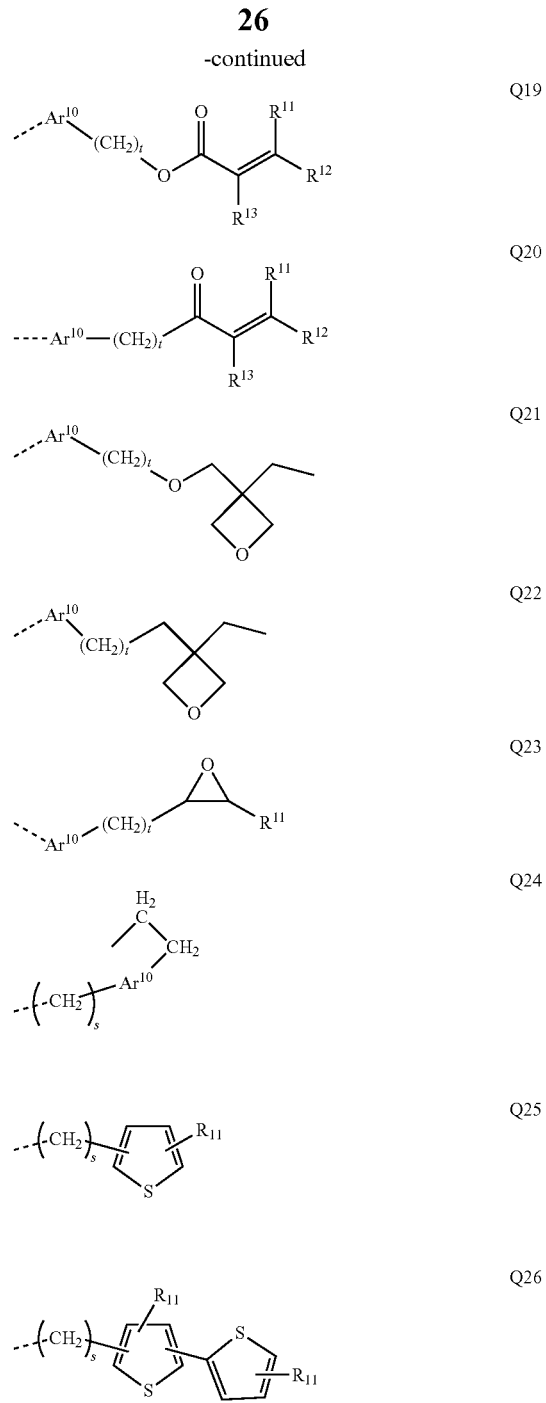

wherein $Ar^{10}$ is a mono- or polycyclic, aromatic or heteroaromatic C5-C60 ring system. Preferably, $Ar^{10}$ is a mono- or polycyclic, aromatic or heteroaromatic C5-C10 ring system. These linker compounds, together with the functionalizing groups, exhibit sufficient reaction kinetics, a sufficient degree of conversion and an effective electronic interaction between the p-dopants among one another and/or with the hole conductor. Consequently, these combinations lead to particularly suitable hole-conducting layers with a high chemical and physical stability and particularly suitable electrical properties.

To illustrate the concept, the following structures are exemplified for possible p-dopants:

B1 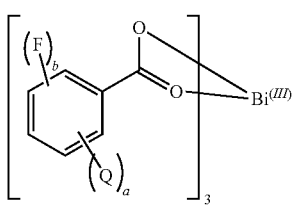
B2 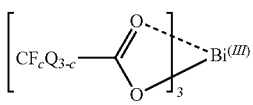
B3 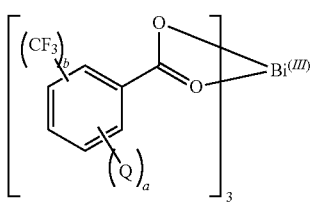
B4 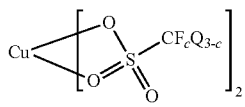
B5 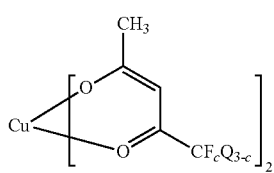
B6 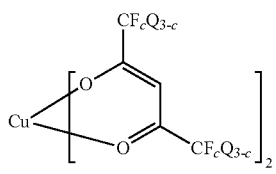
wherein
it may be that a=1-4 and b≤5−a and at least 1,
it may be that c=1 or 2 and
Q is selected from the moieties Q1 to Q29 or is defined in specific examples below.
Further examples of the usable p-dopants result, for example, in
B1a 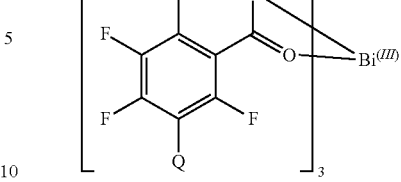
B1b 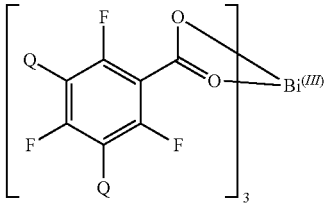
B1c 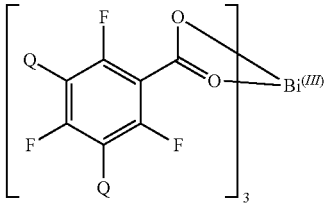
B1d 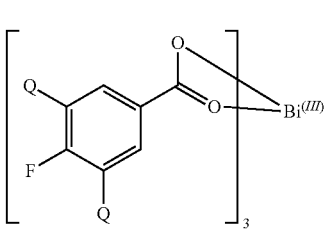
B1e 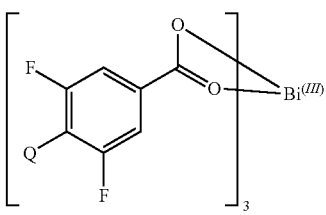
B3f 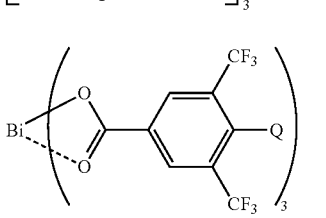
B2a 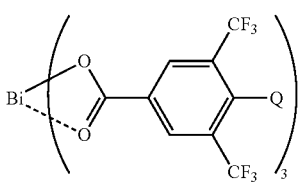
B2b 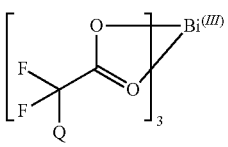
B3a 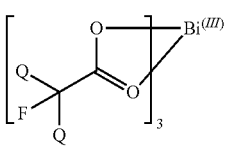

B3b 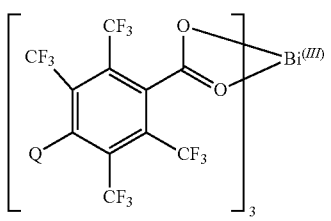

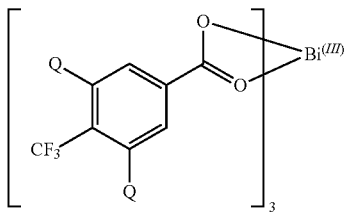
B3c

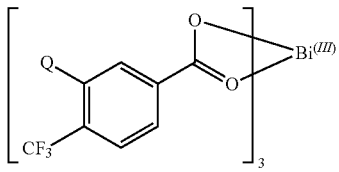
B3d

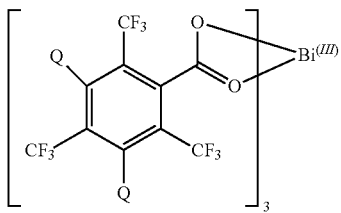
B3e

B4a 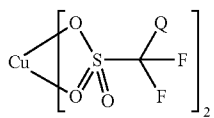

B4b 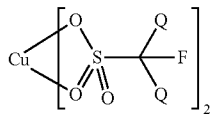

B5a 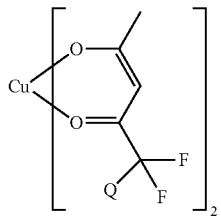

B5b 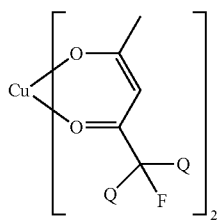

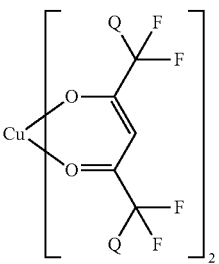
B6a

The structure of the p-dopant can be seen in which at least one metal and one or more ligands are present, wherein at least one of the ligands has a structure of formula I-VIII with a functionalizing group. In particular, it is also shown that the substitutable H atoms of the ligands can be replaced by F atoms.

Of course, the different structures of functionalizing group and ligand can be combined. Thus, for example, different p-dopants can result from combination of the abovementioned complexes with moieties having different functionalities. The following combinations are mentioned as examples (designation for the total complex (Kv), basic structure of the dopant (B), functionalizing group (Q)):

Kv1,B1,Q2; Kv2,B1,Q9; Kv3,B1,Q13; Kv4,B1,Q14; Kv5, B1,Q16; Kv6,B1,Q21; Kv7,B1,Q23; Kv8,B1,Q24; Kv9,B1, Q25; Kv10,B1,Q26; Kv11,B2,Q1; Kv12,B2,Q2; Kv13,B2, Q9; Kv14,B2,Q10; Kv15,B2,Q15; Kv16,B2,Q17; Kv17,B2, Q22; Kv18,B3,Q3; Kv19,B3,Q12; Kv20,B3,Q4; Kv21,B3, Q13; Kv22,B3,Q9; Kv23,B3,Q7; Kv24,B3,Q2; Kv25,B3, Q11; Kv26,B3,Q14; Kv27,B3,Q16; Kv28,B3,Q21; Kv29, B3,Q24; Kv30,B3,Q25; Kv31,B4,Q13; Kv32,B4,Q19; Kv33,B4,Q22; Kv34,B5,Q2; Kv35,B5,Q7; Kv36,B5,Q8; Kv37,B5,Q26; Kv38,B5,Q13; Kv39,B6,Q1; Kv40,B6,Q2; Kv41,B6,Q6; Kv42,B6,Q9; Kv43,B6,Q13; Kv44,B6,Q20; Kv45,B6,Q21; Kv46,B6,Q24; Kv47,B6,Q26; Kv48,B6,Q5; Kv49,B6,Q18; Kv50,B1,Q27; Kv51,B1,Q28; Kv52,B1, Q29; Kv50,B3,Q27; Kv51,B3,Q28; Kv52,B3,Q29.

Further, preferred p-dopants result in:
Kv1a,B1a,Q2a; Kv2a,B1a,Q9b; Kv3a,B1a,Q27; Kv4a,B1a, Q28; Kv5a,B1a,Q29; Kv1f,B3f,Q27; Kv2f,B3f,Q28; Kv3f, B3f,Q29; Kv2b,B1e,Q9a; Kv3a,B1e,Q13a; Kv3b,B1a, Q13a; Kv6a,B1c,Q21a; Kv8a,B1d,Q24a; Kv9a,B1e,Q25a; Kv10a,B1a,Q26b; Kv10b,B1a,Q26a; Kv12a,B2a,Q2a; Kv13a,B2a,Q9b; Kv13b,B2b,Q9a; Kv19a,B3d,Q12a; Kv20a,B3a,Q4a; Kv21a,B3a,Q13a; Kv21b,B3b,Q13a; Kv22a,B3e,Q9a; Kv22b,B3a,Q9b; Kv24a,B3c,Q2a; Kv25a, B3d,Q11a; Kv26a,B3a,Q14a; Kv27a,B3b,Q16a; Kv28a, B3e,Q21a; Kv29a,B3a,Q24a; Kv30a,B3e,Q25a; Kv31a, B4a,Q13a; Kv32a,B4a,Q19b; Kv32b,B4b,Q19b; Kv34a, B5a,Q2a; Kv35a,B5a,Q7a; Kv35b,B5b,Q7b; Kv37a,B5a, Q26a; Kv38a,B5a,Q13a; Kv39a,B6a,Q1a; Kv40a,B6a,Q2a; Kv42a,B6a,Q9a; Kv42b,B6a,Q9b.

For example, the p-dopant Kv3a has the following structure:

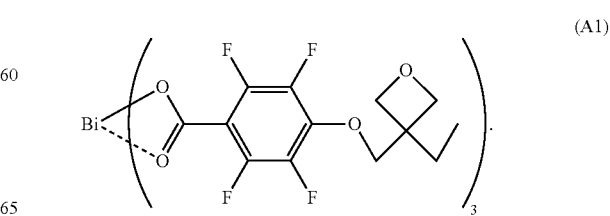

(A1)

Particularly preferred p-dopants result in:
Kv1b,B1a,Q2b; Kv1c,B1a,Q2c; Kv2a,B1a,Q9b; Kv2b,B1a, Q9a; Kv3a,B1a,Q27; Kv4a,B1a,Q28; Kv5a,B1a,Q29; Kv1f, B3f,Q27; Kv2f,B3f,Q28; Kv3f,B3f,Q29; Kv3c,B1e,Q13b; Kv3d,B1e,Q13c; Kv3e,B1e,Q13d; Kv3f,B1e,Q13e; Kv3g, B1a,Q13b; Kv3h,B1a,Q13c; Kv6b,B1c,Q21b; Kv6c,B1c, Q21c; Kv8b,B1d,Q24b; Kv8c,B1d,Q24c; Kv8d,B1d,Q24d; Kv9b,B1e,Q25c; Kv10c,B1a,Q26e; Kv10d,B1a,Q26g; Kv12b,B2a,Q2c; Kv13a,B2a,Q9b; Kv13b,B2b,Q9a; Kv19a, B3d,Q12a; Kv20a,B3a,Q4b; Kv21c,B3a,Q13b; Kv21d,B3a, Q13d; Kv21e,B3b,Q13e; Kv22a,B3e,Q9a; Kv22b,B3a,Q9b; Kv24b,B3c,Q2c; Kv26b,B3a,Q14b; Kv26c,B3a,Q14c; Kv28b,B3e,Q21b; Kv28c,B3e,Q21c; Kv29b,B3a,Q24b; Kv29c,B3a,Q24c; Kv29d,B3a,Q24e; Kv30b,B3e,Q25c; Kv30c,B3e,Q25e; Kv31b,B4a,Q13c; Kv31c,B4a,Q13d; Kv32c,B4a,Q19c; Kv32d,B4a,Q19d; Kv34b,B5a,Q2c; Kv35c,B5a,Q7c; Kv35d,B5b,Q7d; Kv37b,B5a,Q26d; Kv38b,B5a,Q13b; Kv38c,B5a,Q13e; Kv39b,B6a,Q1b; Kv40b,B6a,Q2c; Kv42a,B6a,Q9a; Kv42b,B6a,Q9b.

These ligand/moiety combinations result in particularly effective p-dopants, which can be used particularly well in the context of wet processes and lead to highly crosslinked layers.

In an additional characteristic of the method, it is possible to arrange between the ligand or the hole conductor and the functionalizing moiety from the group $R_F$ a linker, wherein the linker is selected from 1-10 covalently linked units from the group comprising N,N'-bis(naphthalene-1-yl)-N,N'-bis(phenyl)-9,9-dimethylfluorenes, N,N'-bis(3-methylphenyl)-N,N'-bis(phenyl)-9,9-diphenyl-fluorenes, N,N'-bis(naphthalene-1-yl)-N,N'-bis(phenyl)-9,9-diphenylfluorenes, N,N'-bis(naphthalene-1-yl)-N,N'-bis(phenyl)-2,2-dimethylbenzidines, N,N'-bis(3-methylphenyl)-N,N'-bis(phenyl)-9,9-spirobifluorenes, 2,2',7,7'-tetrakis(N,N-diphenylamino)-9,9'-spirobifluorenes, N,N'-bis(naphthalene-1-yl)-N,N'-bis (phenyl)-benzidines, N,N'-bis(naphthalene-2-yl)-N,N'-bis (phenyl)-benzidines, N,N'-bis(3-methylphenyl)-N,N'-bis(phenyl)-benzidines, N,N'-bis(3-methylphenyl)-N,N'-bis(phenyl)-9,9-dimethyl-fluorenes, N,N'-bis(naphthaene-1-yl)-N,N'-bis(phenyl)-9,9-spirobifluorene, di-[4-(N,N-ditolylamino)-phenyl]cyclohexanes, 2,2',7,7'-tetra (N,N-di-tolyl)-amino-spiro-bifluorenes, 9,9-bis[4-(N,N-bis-biphenyl-4-yl-amino)phenyl]-9H-fluorenes, 2,2',7,7'-tetrakis[N-naphthalenyl(phenyl)-amino]-9,9-spiro-bifluorenes, 2,7-bis[N, N-bis(9,9-spiro-bifluorene-2-yl)-amino]-9,9-spirobifluorenes, 2,2'-bis[N,N'-bis(biphenyl-4-yl)amino]-9,9-spirobifluorenes, N,N'-bis(phenanthren-9-yl)-N,N'-bis(phenyl)benzidine, N,N,N',N'-tetra-naphthalene-2-yl-benzidines, 2,2'-bis(N,N-di-phenyl-amino)-9,9-spirobifluorenes, 9,9-bis[4-(N,N-bis-naphthalene-2-yl-amino)phenyl]-9H-fluorenes, 9,9-bis[4-(N,N'-bis-naphthalene-2-yl-N,N'-bis-phenyl-amino)-phenyl]-9H-fluorenes, titanium oxide phthalocyanines, copper phthalocyanines, 2,3,5,6-tetrafluoro-7,7,8,8-tetra-cyano-quinodimethanes, 4,4',4"'-tris(N-3-methylphenyl-N-phenylamino) triphenylamines, 4,4',4"'-tris(N-(2-naphthyl)-N-phenyl-amino) triphenylamines, 4,4',4"'-tris(N-(1-naphthyl)-N-phenyl-amino) triphenylamines, 4,4',4"'-tris(N,N-diphenyl-amino)triphenylamines, pyrazino[2,3-f][1,10]phenanthroline-2,3-dicarbonitriles, N,N,N',N'-tetrakis (4-methoxyphenyl)benzidines or mixtures thereof. By selecting these particular linker molecules, it is possible to obtain flexible functionalized ligands and hole conductors in which the distance of the functionalized group from the hole conductor or ligand can be freely determined and the ability for hole conduction is limited to a very limited extent. This allows even the construction of larger linker units, without sacrificing the transfer of electrical charge from the dopant to the hole conductor.

Our method may include the hole conductor or the basic structure of the organic hole conductor without functionalizing moiety is selected from the group comprising PEDOT (poly(3,4-ethylenedioxythiophene)), PVK (poly(9-vinylcarbazole)), PTPD (poly(N,N'-bis(4-butylphenyl)-N,N'-bis (phenyl)benzidine), PANI (polyaniline), P3HT (poly(3-hexylthiophene)) or mixtures thereof. This group of hole conductors can be functionalized relatively easily with high conversions and that highly conductive and chemically very stable layers can be obtained by the method.

In an additional process characteristic, the crosslinked, hole-conducting electrical layer can be produced by a solvent process. Our process overcomes in particular the disadvantage of conventional solvent processes that require that solvents of subsequent layers have to be complementary to the solvent of already deposited layers. In the standard procedures, this boundary condition must be adhered to, as otherwise already deposited layers are redissolved. This severely restricts the selection and the process capability, since very complex layer structures are required for efficient components. This boundary condition is omitted in the process since by the crosslinking reaction chemically and physically "inert" layers are available and therefore subsequent layers can work with any solvents, without the risk that underlying layers are redissolved. The tuning of the solvent can thus be tuned purely to the substances to be deposited in the relevant layer. This can significantly increase the uniformity of the layers and significantly simplify the process. Suitable solvents are, for example, those mentioned in DE 102012209523 for the solution processing. DE 102012209523 is hereby incorporated by reference with respect to the solvents.

In an additional process characteristic, the crosslinked, hole-conducting electrical layer can be produced by a vacuum process. Thereby, the functionalized p-dopants and the hole conductor or the functionalized p-dopants and the functionalized hole conductor are evaporated in vacuum and then deposited.

The crosslinked, hole-conducting electrical layer may have a layer thickness of 1 nm to 1000 nm, preferably 30 nm to 300 nm, for example, 200 nm.

Furthermore, a crosslinked hole-conducting layer is obtainable by the process described herein. This process is particularly suitable for providing highly homogeneous, crosslinked hole-conducting layers which are not obtainable by the standard methods of organic electronics.

Furthermore, organic, electronic components, comprising a crosslinked, hole-conducting electrical layer, which were prepared by our process or can be produced. In particular in organic electrical components, the hole-conducting layers can be used particularly advantageously. On the one hand, the presented process management enables a highly efficient and cost-effective production and, on the other hand, particularly durable and solvent-resistant p-conductive layers are obtained by the stabile binding of the p-dopant to the hole conductors. This can contribute to a high extent to the reliability and good further processability of the components thus obtainable. The method described and the crosslinkable layers that can be produced thereby can be used correspondingly for components such as photodiodes or solar cells. In particular, the method is also suitable for producing bipolar transistors. The method is compatible with the standard manufacturing steps of these components and thus can be cost-effective, durable and efficient components can be obtained.

The organic electronic component may be selected from a group comprising organic transistors, organic light emitting diodes, organic light emitting electrochemical cells, organic solar cells and organic photodetectors.

The organic transistor may be a field-effect transistor or a bipolar transistor. Bipolar transistors are described, for example, in DE 10 2010 041 331 A1 in more detail.

The organic electronic device may be an organic light emitting diode.

The organic light emitting diode may comprise a light emitting layer.

With regard to the basic structure of an organic light-emitting diode, for example, with regard to the structure, the layer compositions and the materials of the substrate, the anode and the cathode and the encapsulation arrangement, reference is made to WO 2010/066245 A1, which, particularly with respect to the structure, the layer compositions and the materials of the substrate, the anode and the cathode and the encapsulation arrangement, is hereby expressly incorporated by reference.

With regard to further advantages and features of the above-described organic components is hereby explicitly referred to the explanations in connection with our layers and our methods. Also, features and advantages of our methods should also be applicable to the components and the layers and be regarded as disclosed and vice versa. This disclosure also includes all combinations of at least two features disclosed in the description and/or the claims, unless explicitly excluded.

Further advantages and developments arise from the examples described below in conjunction with the figures.

In the examples and figures, identical, similar or identically acting elements can each be provided with the same reference numerals. The illustrated elements and their proportions among each other are not to be regarded as true to scale, but individual elements such as layers, components, components and areas, may be for better presentation and/or better understanding exaggeratedly presented.

FIG. 1 shows an examples of an organic light-emitting diode 10. The organic light emitting diode 10 comprises a substrate 1, for example, made of glass. Arranged over the substrate 1 is an anode 2 formed of indium tin oxide, a transparent conductive oxide (TCO). Above the anode, a hole-injecting layer 3, a crosslinked hole-conducting electrical layer 4 and a light-emitting layer 5 are arranged. The crosslinked, hole-conducting electrical layer 4 can be produced, for example, from a hole conductor, for example, PEDOT, a compound functionalized with two amine groups as an additional crosslinker and a functionalized p-dopant. The functionalized p-dopant may have, for example, one of formulas (A1), (A2) and (A3):

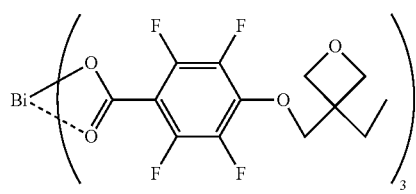

(A1)

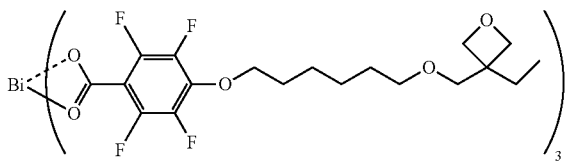

(A2)

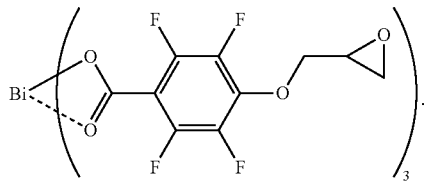

(A3)

The crosslinking takes place via the functionalized p-dopants with the additional crosslinker. This crosslinking leads to a mechanically very stable and chemically inert crosslinked hole-conducting electrical layer 4. In particular, the crosslinked hole-conducting electrical layer 4 is produced by solution processing.

The p-dopant is present at 20% by volume, based on the volume of the hole conductor. The crosslinked, hole-conducting electrical layer 4 has a layer thickness of 200 nm. Above the light-emitting layer 5, a hole-blocking layer 6, an electron-transporting layer 7, an electron-injecting layer 8 and a cathode 9 made of aluminum are arranged. The light emitting layer 5 may include an electron and/or hole transporting material and one or more phosphorescent or fluorescent emitters. Materials for the electron transporting layer 7, the electron-injecting layer 8 and the hole-injecting layer 3 are known to the person skilled in the art. For example, the electron-transporting layer 7 is formed from 2-(4-biphenylyl)-5-(4-tertbutylphenyl)-1,3,4-oxadiazole with an n-dopant NDN-1 or Ca, the electron-injecting layer 8 is formed from 2,9-dimethyl-4,7-diphenyl-1,10-phenanthroline (BCP) and the hole-injecting layer 3 is formed from poly(3,4-ethylenedioxythiophene).

Between the crosslinked, hole-conducting electrical layer 4 and the light-emitting layer 5, an electron-blocking layer may be arranged (not shown here). Materials for the electron-blocking layer are known. For example, bis(2-methyl-8-quinolinolato)-4-(phenylphenolato) aluminum can be used.

The functionalized p-dopant of the formula (A3) can be synthesized, for example, by the following synthesis:

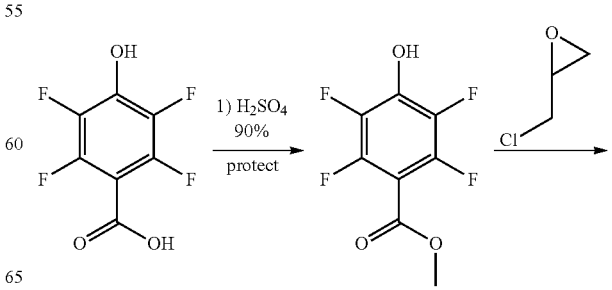

-continued

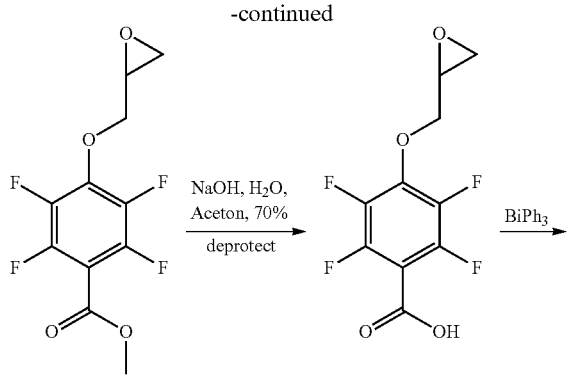

For example, 4-hydroxy-2,3,5,6-tetra-fluorobenzoic acid is commercially available from Fluorochem. In this compound, the acid group must first be protected by an esterification reaction from reacting with the epichlorohydrin. This is done by adding sulfuric acid. Subsequently, the reaction of 4-ydroxy-2,3,5,6-tetra-fluorobenzoic acid methyl ester with epichlorohydrin, which is commercially available, for example, from Sigma Aldrich. After deprotection of the acid group, a reaction with triphenyl bismuth to give the functionalized p-dopant is performed.

The reaction with epichlorohydrin for methyl-4-hydroxy benzoate with subsequent saponification of the ester and for 4-hydroxy-benzaldehydes with subsequent oxidation to the carboxylic acid are described in Cheedarala, Ravi Kumar; Sunkara, Vijaya; Park, Joon Won, Synthetic Communications, 2009, Vol. 39, 11, 1966-1980 and Obreza, A.; Perdith, F.; Journal of Structural Chemistry, 2012, Vol. 53, 4, 793-799, 7. Furthermore, this reaction is also described for perfluorophenol with epichlorohydrin in Solov'ev, D. V.; Kolomenskaya. L. V; Rodin, A. A.; Zenkevich, I. G.; Lavrent'ev, A. N.; J. Gen. Chem. USSR (Engl. Transl. 1991, Vol. 61, 3.2, 673-678, 611-615.

The functionalized p-dopant of the formula A1 can be synthesized, for example, by the following synthesis:

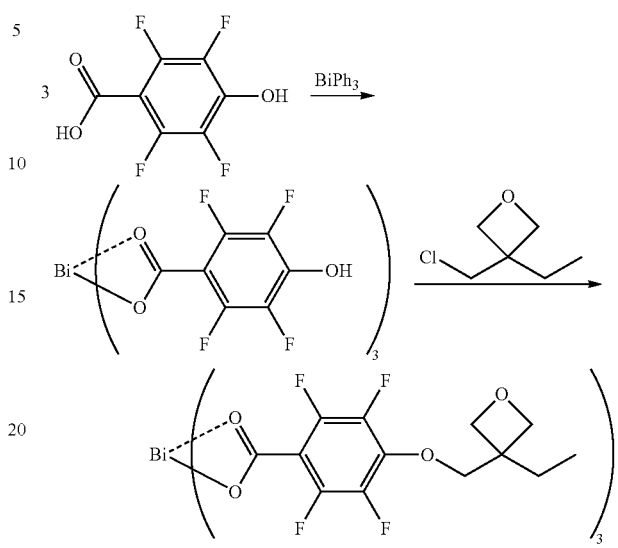

First, a reaction of 4-hydroxy-2,3,5,6-tetra-fluorobenzoic acid with triphenyl bismuth takes place. In a second step a reaction with 3-chloromethyl-3-ethyloxetane to the desired functionalized p-dopant of formula (A3) takes place.

The functionalized p-dopant of formula (A2) can be synthesized, for example, by the following synthesis:

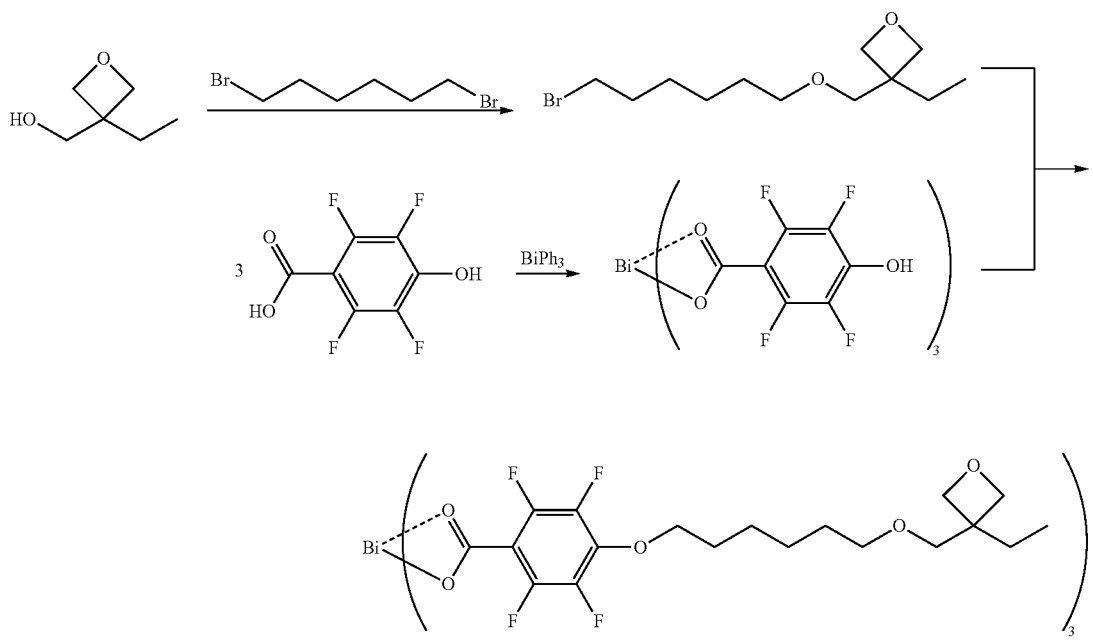

First, 3-ethyl-3-hydroxymethyl-oxetane is reacted equimolar with 1,6-dibromohexane to substitute a bromine. After any necessary chromatographic purification, a reaction is carried out with the bismuth complex prepared from 4-hydroxy-2,3,5,6-tetra-fluorobenzoic acid with triphenyl bismuth to form the functionalized p-dopant of formula (A2).

An alternative synthetic route for the functionalized dopant of formula (A2) is as follows:

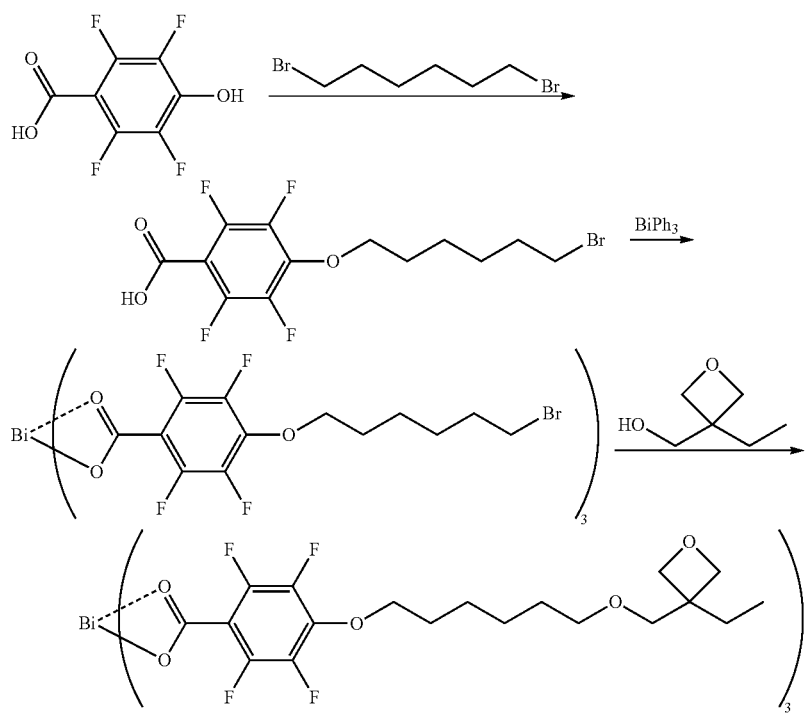

First, a reaction of 4-hydroxy-2,3,5,6-tetra-fluorobenzoic acid with 1,6-dibromohexane and in a next step the reaction with triphenyl bismuth take place. In a third step, a reaction with 3-ethyl-3-hydroxymethyl oxetane to the desired functionalized p-dopant of formula (A2) takes place.

The oxetanes 3-ethyl-3-hydroxymethyl-oxetane and 3-chloromethyl-3-ethyloxetane used can be prepared as follows:

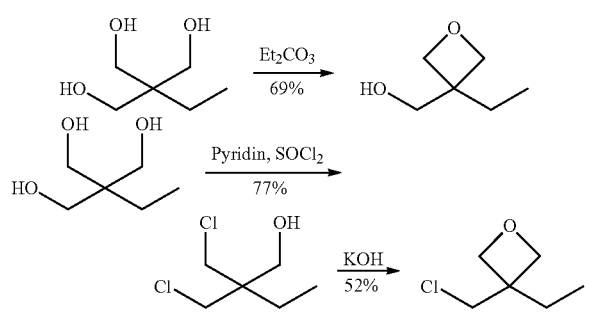

Figure 2:
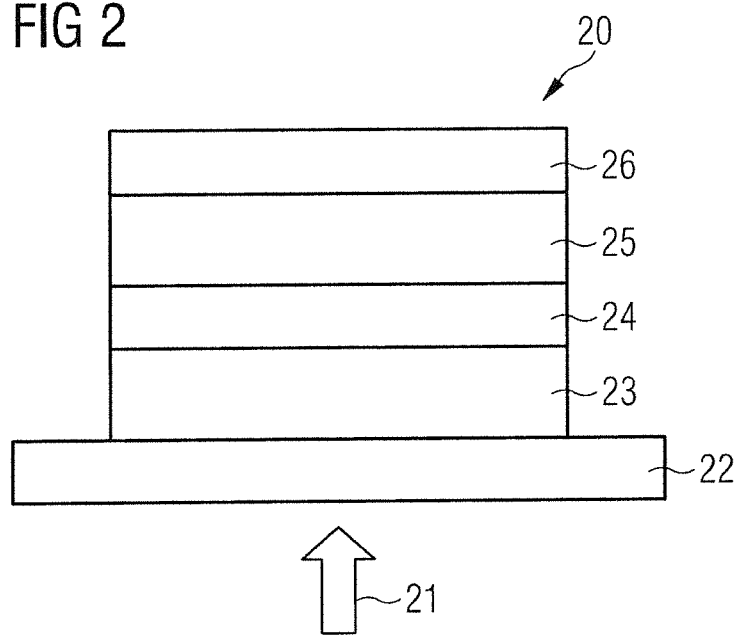
FIG. 2 shows a schematic side view of an example of an organic solar cell.
Figure 3A:
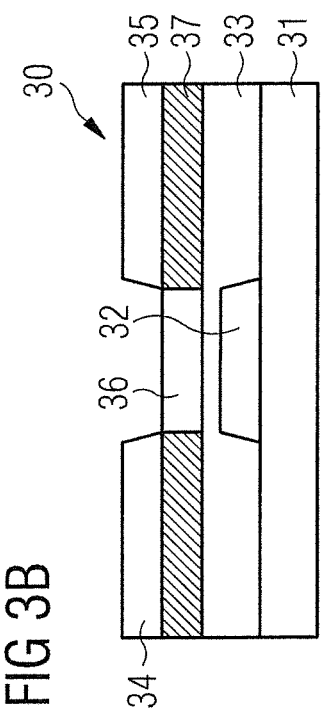
FIGS. 3A to 3F show schematic side views of examples of an organic field effect transistor.
Figure 3B:
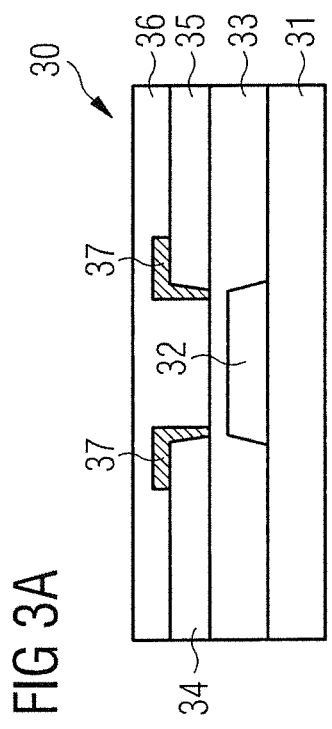
Figure 3C:
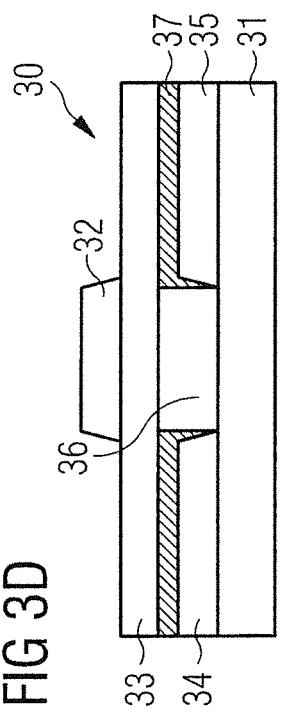
Figure 3D:
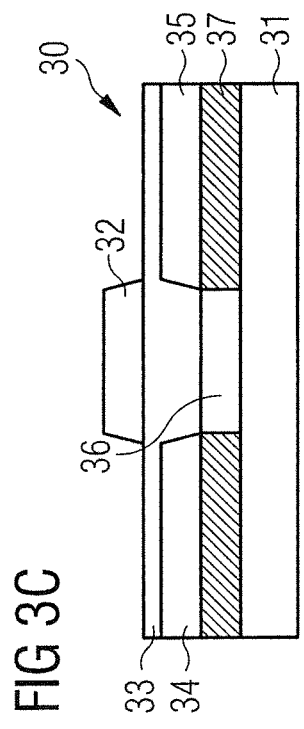
Figure 3E:
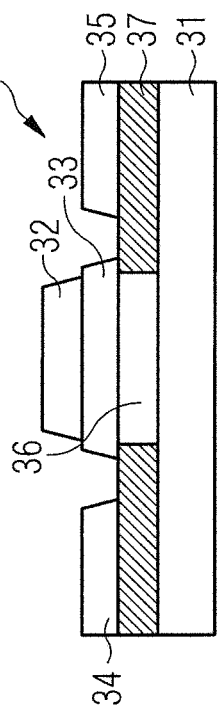
Figure 3F:
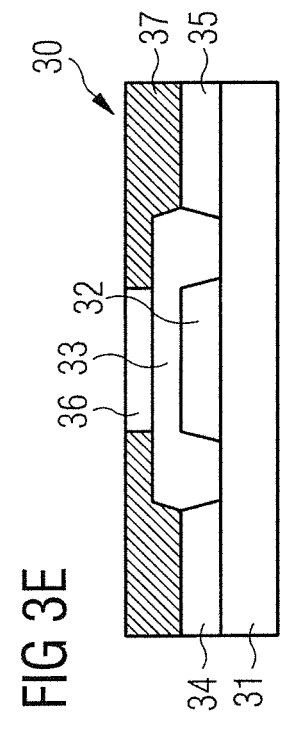

FIG. 2 shows an example of an organic solar cell with PIN structure 20 that converts light 21 into electrical current. The solar cell 20 comprises or consists of an anode of indium tin oxide 22, a crosslinked, hole-conducting electrical layer 23, an absorption layer 24, a doped electron-transporting layer 25 and a cathode 26. The crosslinked, hole-conducting electrical layer 23 has a layer thickness of 150 nm.

The crosslinked, hole-conducting electrical layer 23 can be produced, for example, from a hole conductor functionalized with two primary amine groups, for example, PVK (poly(9-vinylcarbazole)) and a functionalized p-dopant. The functionalized p-dopant may, for example, have formula (A4):

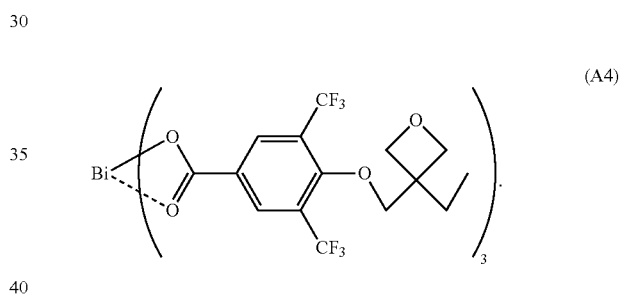

The crosslinking takes place by a reaction of the functionalized p-dopants with the functionalized hole conductor. For example, the hole conductor is functionalized with two aromatic secondary amine groups. This crosslinking leads to a mechanically very stable and chemically inert crosslinked hole-conducting electrical layer 23.

The functionalized p-dopant is present at 15% by volume based on the volume of the functionalized hole conductor. The materials for the further layers are known. In the absorption layer 24, light is absorbed from the environment. As a result of the absorption of light, a molecule of the absorption layer 24 changes into the excited state and a charge separation occurs. During charge separation, an exciton, that is, an electron-hole pair, forms. These unequally charged charges must now be separated from each other. This is especially possible when the electron is taken up by a strong acceptor and/or the hole is taken up by a strong donor. Such a strong acceptor represents the crosslinked, hole-conducting electrical layer 23. The crosslinked, hole-conducting electrical layer 23 has a positive effect on the charge extraction and thus on the efficiency of organic solar cells.

FIGS. 3A to 3F show examples of organic field-effect transistors 30. On a substrate 31 a gate electrode 32, a gate dielectric 33, a source and drain contact 34 and 35 and an organic semiconductor layer 36 are applied. The hatched areas 37 show the crosslinked, hole-conducting electrical layer. Alternatively, the complete semiconductor layer 36 may be formed as a crosslinked, hole-conducting electrical layer.

Our dopants, conductors and methods are not limited to the examples by the description based on the examples. On the contrary, this disclosure encompasses every new feature as well as every combination of features, which in particular includes any combination of features in the appended claims, even if the feature or combination itself is not explicitly stated in the claims or examples.

This application claims priority of DE 10 2016 111 062.0, the subject matter of which is incorporated herein by reference.

The invention claimed is:

1. A method of producing crosslinked, hole-conducting electrical layers by a reaction of functionalized p-dopants, wherein the functionalized p-dopants are organic metal complexes comprising at least one central atom and organic ligands, wherein the at least one central atom is selected from a metal of groups 6-15 of the Periodic Table and at least one of the organic ligands is selected from formulas (I)-(V):

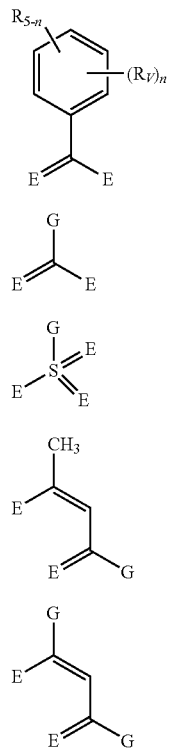

wherein
E is, independently from each other, oxygen, sulfur, selenium or $N(E_1)_x$, $E_1$ is independently from each other selected from the group comprising H, D, substituted or unsubstituted alkyl or aryl and x=0, 1 or 2;
R are independently from each other are H, D, F, C1-C20 branched and unbranched substituted or unsubstituted alkyl or aryl;
$R_V$ are independently from each other selected from the group consisting of substituted or unsubstituted aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl; and each $R_v$ is at least one functionalizing moiety selected from the group $R_F$ comprising —OH, —COOH, —NH$_2$, —NHR', halogen, C2-C40-alkenyl, -dienyl, -alkynyl, -alkenyloxy, -dienyloxy, -alkynyloxy, acrylic acid, oxetane, oxirane, silane, acrylic acid, anhydride and cyclobutane, or consists thereof; wherein R' is a C1-C20 branched, unbranched, substituted or unsubstituted alkyl or aryl;

G=—C(R$_F$)$_u$H$_v$F$_w$ with u+v+w=3; and n=1-4; and 1) the functionalized p-dopants are reacted and crosslinked with each other and the functionalized p-dopants are substituted with different moieties $R_F$, and the one p-dopants have an epoxide or oxetane group as $R_F$ within $R_v$ or G and the other p-dopants have dopants have an NH$_2$-group or an NHR'-group as $R_F$ within $R_v$ or G, or 2) the functionalized p-dopants are reacted with functionalized hole conductors and the functionalized hole conductors also have at least one moiety selected from the group $R_F$ or $R_v$, and the functionalized p-dopants have an epoxide or oxetane group as $R_F$ within $R_v$ or G and the functionalized hole conductors have at least one NH$_2$-group and/or NHR'-group within the group $R_F$ or $R_v$; or 3) the functionalized p-dopants are reacted with functionalized hole conductors and the functionalized hole conductors also have at least one moiety from the group $R_F$ or $R_v$, and the functionalized p-dopants have an NH$_2$-group and/or NHR'-group as RF within $R_v$ or G and the functionalized hole conductors have an epoxide or oxetane group within the group $R_F$ or $R_v$.

2. The method according to claim 1, wherein the functionalized p-dopants are reacted among each other and crosslink.

3. The method according to claim 1, wherein the functionalized p-dopants are reacted with functionalized hole conductors and the functionalized hole conductors also have at least one moiety from the group $R_F$ or $R_v$, and the functionalized p-dopants crosslink with the functionalized hole conductors.

4. The method according to claim 1, wherein the metal complex comprises bismuth, tin, zinc, rhodium, molybdenum, chromium or copper and at least one of the organic ligands corresponds to formula (I).

5. The method according to claim 1, wherein at least one of the organic ligands corresponds to one of formulas (VI), (VII) or (VIII)

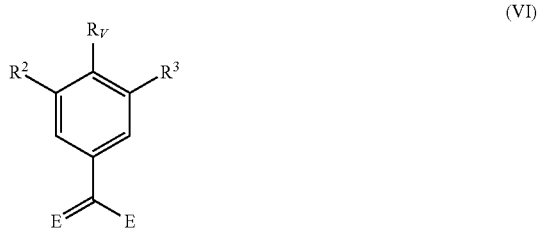

-continued

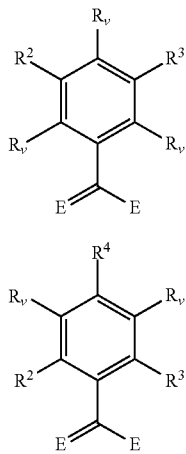
(VII)

(VIII)

wherein

R² and R³ or R², R³ and R⁴ are independently from each other selected from F and branched and unbranched substituted alkyl or substituted aryl.

6. The method according to claim 1, wherein the metal complex comprises bismuth, tin, zinc, rhodium, molybdenum, chromium or copper and at least one of the organic ligands corresponds to formula (II).

7. The method according to claim 1, wherein the metal complex comprises bismuth, tin, zinc, rhodium, molybdenum, chromium or copper and at least one of the organic ligands corresponds to formula (III).

8. The method according to claim 1, wherein the metal complex comprises bismuth, tin, zinc, rhodium, molybdenum, chromium or copper and at least one of the organic ligands corresponds to formula (IV).

9. The method according to claim 1, wherein the metal complex comprises bismuth, tin, zinc, rhodium, molybdenum, chromium or copper and at least one of the organic ligands corresponds to formula (V).

10. The method according to claim 1, wherein the moieties R² and R³, R², R³ and R⁴ or G are each at least mono fluorinated.

11. The method according to claim 1, wherein $R_F$ or $R_v$ comprise the moieties Q1a to Q29 or consist of the moieties Q1a to Q29

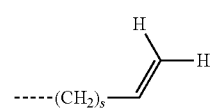
Q1a

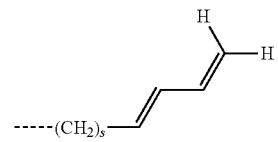
Q2a

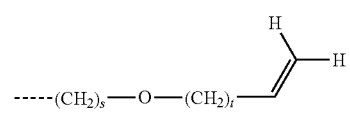
Q4a

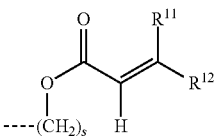
Q7a

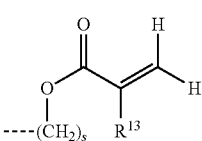
Q7b

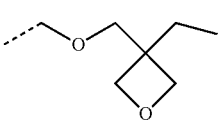
Q9a

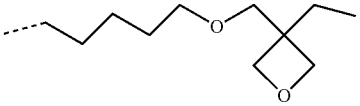
Q9b

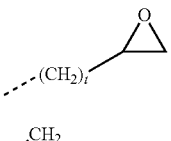
Q11a

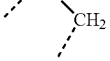
Q12a

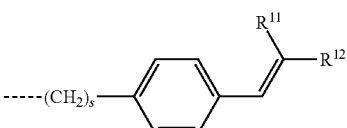
Q13a

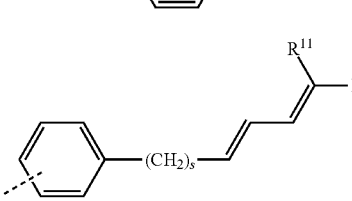
Q14a

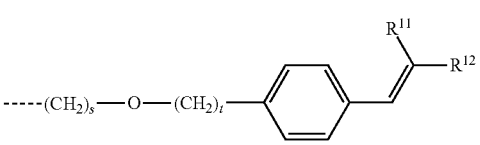
Q16

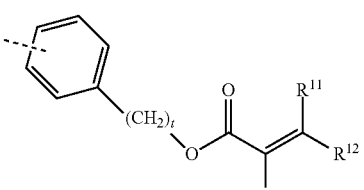
Q19a

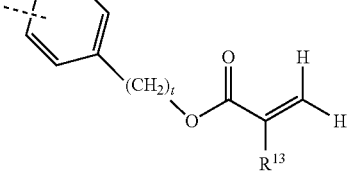
Q19b

Q21a 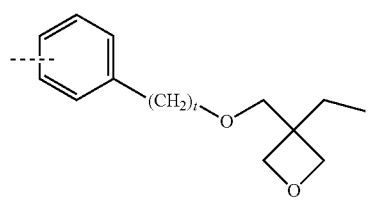

Q24a 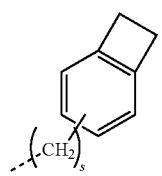

Q25a 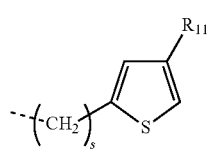

Q25b 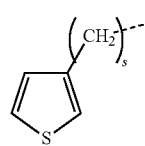

Q26a 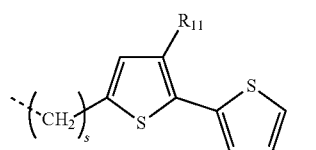

Q26b 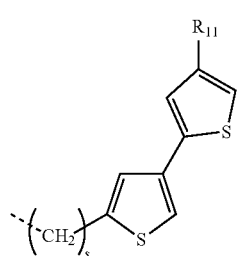

Q26 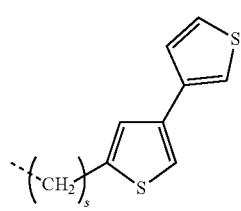

Q27 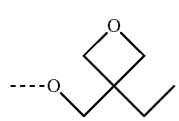

Q28 

Q29 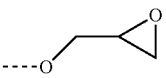

wherein the moieties $R^{11}$ and $R^{12}$ can be identical or different and are selected from the group consisting of H, D or a straight-chain or branched C1-C6 alkyl, $R^{13}$ denotes a straight-chain or branched C1-C6 alkyl, s=0 to 8 and t=1 to 8.

12. The method according to claim 1, wherein $R_F$ or $R_V$ comprise the moieties Q1a to Q29 or consist of the moieties Q1b to Q26g Q1b 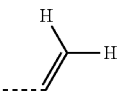

Q1c 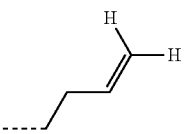

Q2b 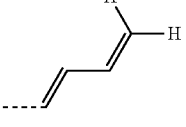

Q2c 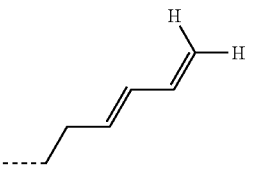

Q4b 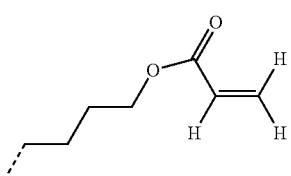

Q7c 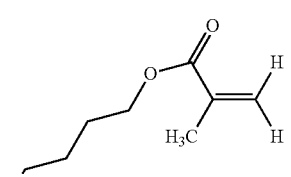

Q7d 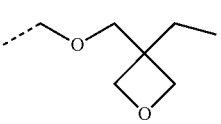

Q9a

Q9b
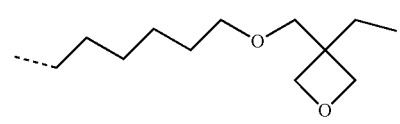
Q11b
Q11c
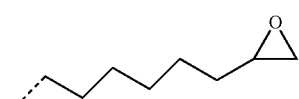
Q12b
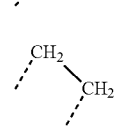
Q13b
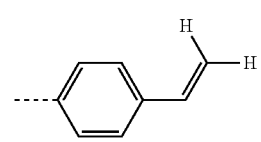
Q13c
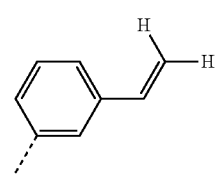
Q13d
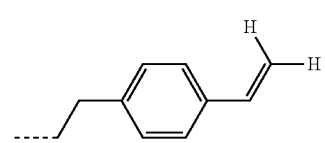
Q13e
Q14b
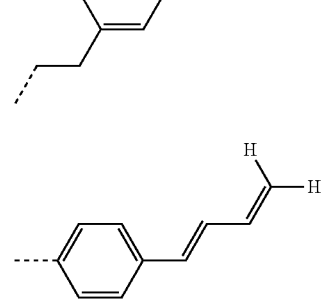
Q14c
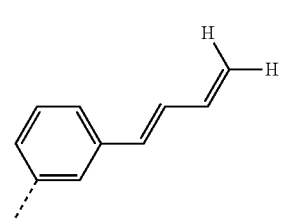
Q14d
Q14e
Q19c
Q19d
Q21b
Q21c
Q24b
Q24c
Q24d
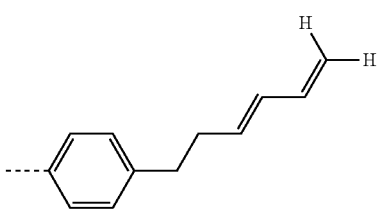

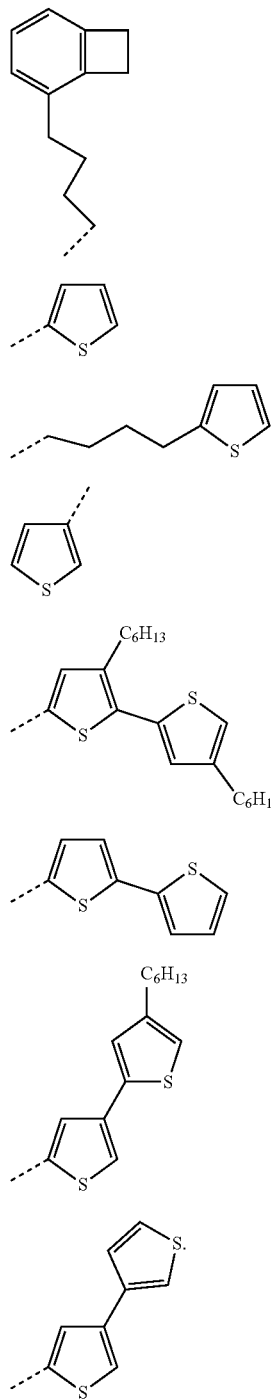

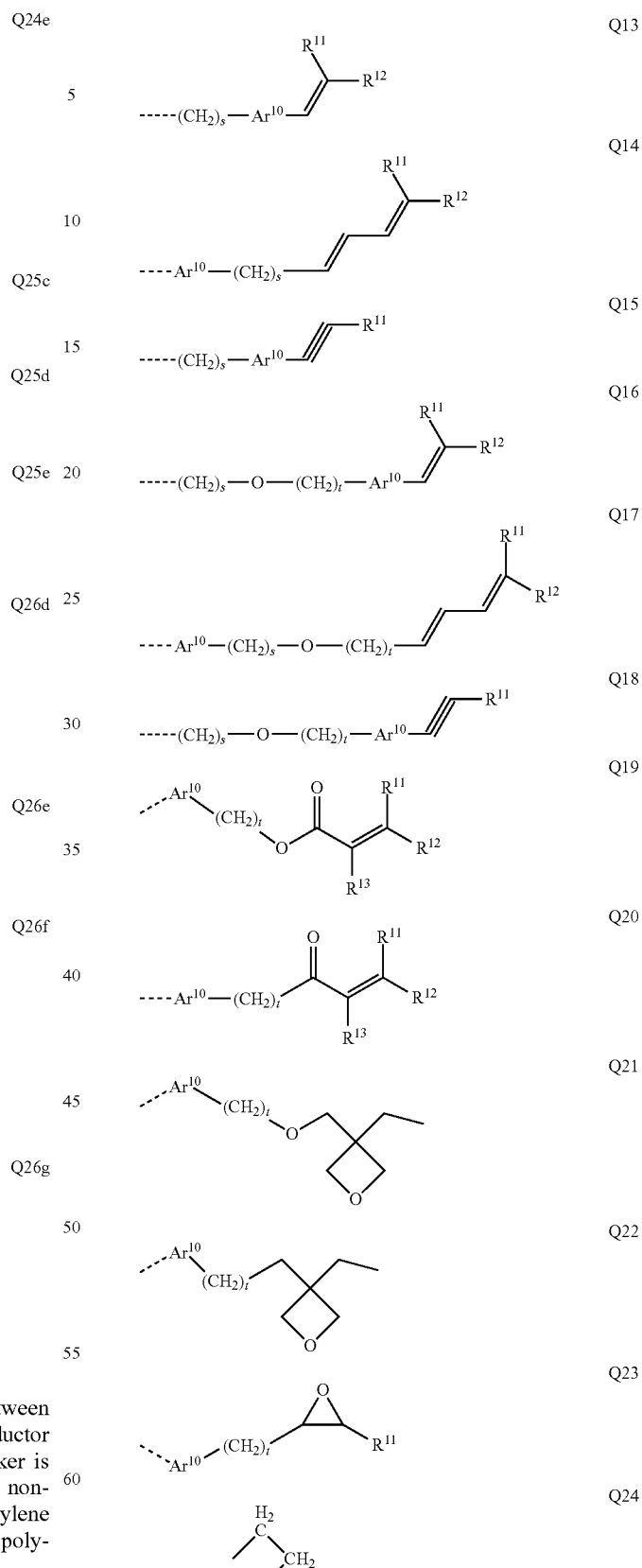

13. The method according to claim 1, wherein between the at least one organic ligand and RF or the hole conductor and RF an additional linker is disposed, and the linker is selected from the group consisting of fluorinated or non-fluorinated C1-C20 alkyl, alkenyl, alkynyl, polyethylene glycol, polyethylene diamine, polyester, polyurethane, polyvinylidene-phenylene or mixtures thereof.

14. The method according to claim 13, wherein the unit of functionalizing moiety $R_F$ and linker, especially $R_v$, is selected from the group consisting of Q13-Q26

-continued

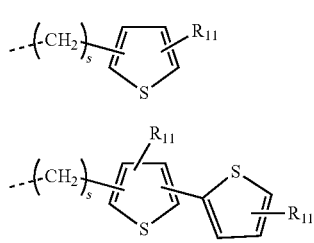

wherein Ar¹⁰ is a mono- or polycyclic, aromatic or heteroaromatic C5-C60 ring system.

15. A crosslinked, hole-conducting electrical layer obtained by the method according to claim 1.

16. An organic, electronic component comprising the crosslinked, hole-conducting electrical layer according to claim 15.

17. A method of producing crosslinked, hole-conducting electrical layers by reaction of functionalized p-dopants, wherein the functionalized p-dopants are organic metal complexes comprising at least one central atom and organic ligands, the central atom is selected from a metal of groups 6-15 of the Periodic Table and at least one of the organic ligands is selected from formulas (I)-(V):

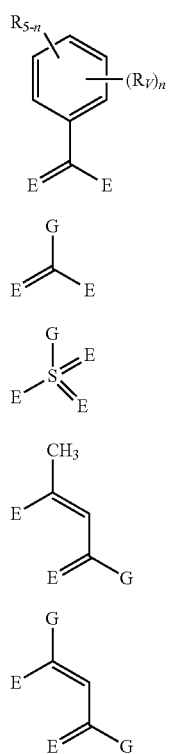

wherein
E is, independently from each other, oxygen, sulfur, selenium or $N(E_1)_x$, $E_1$ is independently from each other selected from the group consisting of H, D, substituted or unsubstituted alkyl or aryl and x=0, 1 or 2;

R are independently from each other are H, D, F, C1-C20 branched and unbranched substituted or unsubstituted alkyl or aryl;

$R_V$ are independently from each other selected from the group comprising substituted or unsubstituted aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl; and each $R_V$ is at least one functionalizing moiety selected from the group $R_F$ comprising —OH, —COOH, —NH₂, —NHR', halogen, C2-C40-alkenyl, -dienyl, -alkynyl, -alkenyloxy, -dienyloxy, -alkynyloxy, acrylic acid, oxetane, oxirane, silane, acrylic acid, anhydride and cyclobutane, or consists thereof;

R' is a C1-C20 branched, unbranched, substituted or unsubstituted alkyl or aryl;

G=—C$(R_F)_u$H$_v$F$_w$ with u+v+w=3; and n=1-4; and the functionalized p-dopants are reacted and cross-linked with each other and the functionalized p-dopants are substituted with different moieties $R_F$, the one p-dopants have an epoxide or oxetane group as $R_F$ within $R_V$ or G and the other p-dopants have an NH₂-group or an NHR'-group as $R_F$ within $R_V$ or G; or the functionalized p-dopants are reacted with functionalized hole conductors and the functionalized hole conductors also have at least one moiety selected from the group $R_F$ or $R_V$, the functionalized p-dopants have an epoxide or oxetane group as $R_F$ within $R_V$ or G and the functionalized hole conductors have at least one NH₂-group and/or NHR'-group within the group $R_F$ or $R_V$, or the functionalized p-dopants are reacted with functionalized hole conductors and the functionalized hole conductors also have at least one moiety from the group $R_F$ or $R_V$, and the functionalized p-dopants have an NH₂-group and/or NHR'-group as RF within $R_V$, or G and the functionalized hole conductors have an epoxide or oxetane group within the group $R_F$ or $R_V$.

18. A method of producing crosslinked, hole-conducting electrical layers by a reaction of functionalized p-dopants, wherein the functionalized p-dopants are organic metal complexes comprising at least one central atom and organic ligands, wherein the at least one central atom is selected from a metal of groups 6-15 of the Periodic Table and at least one of the organic ligands is selected from formulas (I)-(V):

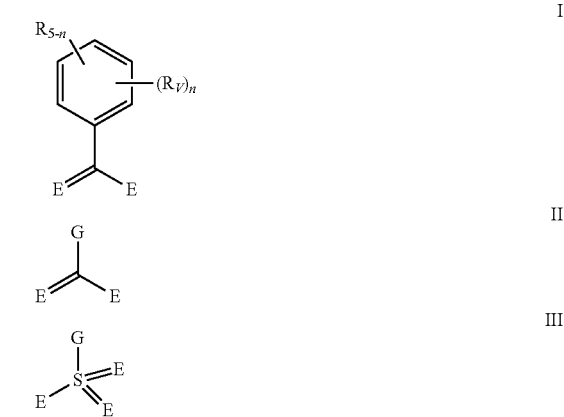

-continued

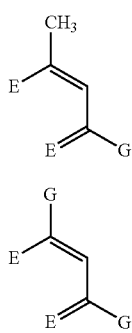

IV

V wherein
E is, independently from each other, oxygen, sulfur, selenium or $N(E_1)_x$, $E_1$ is independently from each other selected from the group comprising H, D, substituted or unsubstituted alkyl or aryl and x=0, 1 or 2;

R are independently from each other are H, D, F, C1-C20 branched and unbranched substituted or unsubstituted alkyl or aryl;

$R_\nu$ are independently from each other selected from the group consisting of substituted or unsubstituted aryl, alkyl, alkoxy, cycloalkyl, arylenes, haloaryl, heteroaryl, heteroarylenes, heterocycloalkylenes, heterocycloalkyl, haloheteroaryl, alkenyl, haloalkenyl, alkynyl, haloalkynyl, ketoaryl, haloketoaryl, ketoheteroaryl, ketoalkyl, haloketoalkyl, ketoalkenyl, haloketoalkenyl; and each $R_\nu$ is at least one functionalizing moiety selected from the group $R_F$ comprising —OH, —COOH, —NH$_2$, —NHR', halogen, C2-C40-alkenyl, -dienyl, -alkynyl, -alkenyloxy, -dienyloxy, -alkynyloxy, acrylic acid, oxetane, oxirane, silane, acrylic acid, anhydride and cyclobutane, or consists thereof; wherein R' is a C1-C20 branched, unbranched, substituted or unsubstituted alkyl or aryl;

$G=-C(R_F)_uH_vF_w$ with u+v+w=3; and n=1-4; and between the at least one organic ligand and RF or the hole conductor and RF an additional linker is disposed, and the linker is selected from the group consisting of fluorinated or non-fluorinated C1-C20 alkyl, alkenyl, alkynyl, polyethylene glycol, polyethylene diamine, polyester, polyurethane, polyvinylidene-phenylene or mixtures thereof.

19. The method according to claim 18, wherein the unit of functionalizing moiety RF and linker, especially $R_\nu$, is selected from the group consisting of Q13-Q26

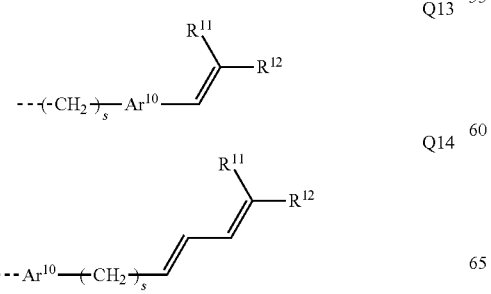

Q13

Q14

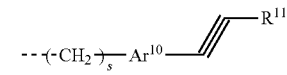 Q15

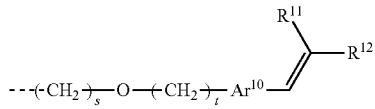 Q16

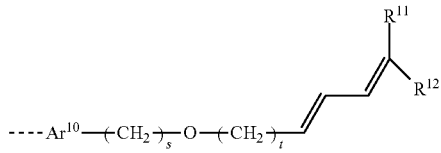 Q17

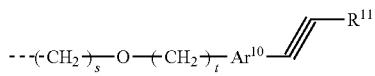 Q18

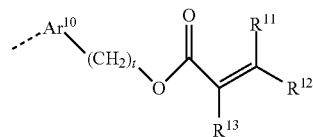 Q19

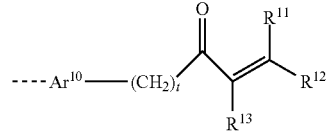 Q20

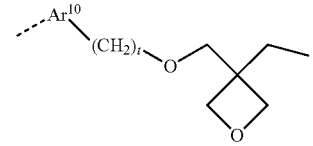 Q21

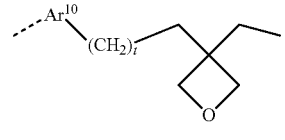 Q22

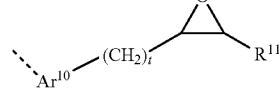 Q23

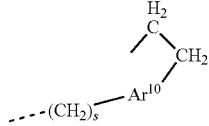 Q24

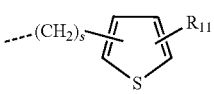 Q25

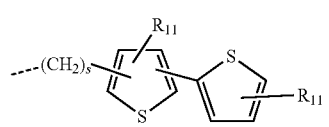 Q26
wherein $Ar^{10}$ is a mono- or polycyclic, aromatic or heteroaromatic C5-C60 ring system.
* * * * *